(12) United States Patent
Misaki

(10) Patent No.: US 11,081,517 B2
(45) Date of Patent: Aug. 3, 2021

(54) ACTIVE MATRIX SUBSTRATE, X-RAY IMAGING PANEL WITH THE SAME, AND METHOD OF MANUFACTURING THE SAME

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/661,292

(22) Filed: Oct. 23, 2019

(65) Prior Publication Data

US 2020/0135797 A1 Apr. 30, 2020

Related U.S. Application Data

(60) Provisional application No. 62/752,091, filed on Oct. 29, 2018.

(51) Int. Cl.
| | |
|---|---|
| *H01L 27/146* | (2006.01) |
| *H01L 27/12* | (2006.01) |
| *H01L 21/4757* | (2006.01) |
| *G01T 1/24* | (2006.01) |
| *H01L 29/786* | (2006.01) |
| *H01L 29/66* | (2006.01) |

(Continued)

(52) U.S. Cl.
CPC ...... *H01L 27/14663* (2013.01); *G01T 1/2006* (2013.01); *G01T 1/241* (2013.01); *H01L 21/47573* (2013.01); *H01L 27/124* (2013.01); *H01L 27/1225* (2013.01); *H01L 27/1259* (2013.01); *H01L 27/14612* (2013.01); *H01L 27/14636* (2013.01); *H01L 27/14689* (2013.01); *H01L 29/66969* (2013.01); *H01L 29/78693* (2013.01); *H01L 31/115* (2013.01)

(58) Field of Classification Search
CPC combination set(s) only.
See application file for complete search history.

(56) References Cited

U.S. PATENT DOCUMENTS

| | | | |
|---|---|---|---|
| 6,407,393 B1 * | 6/2002 | Kim | H01L 27/14603 |
| | | | 250/370.09 |
| 6,423,973 B2 * | 7/2002 | Choo | H01L 27/14665 |
| | | | 250/370.09 |

(Continued)

FOREIGN PATENT DOCUMENTS

JP 2014-149410 A 8/2014

*Primary Examiner* — Michelle Mandala
*Assistant Examiner* — Jordan M Klein
(74) *Attorney, Agent, or Firm* — ScienBiziP, P.C.

(57) ABSTRACT

An active matrix substrate includes a TFT. The TFT includes a gate electrode, a semiconductor layer overlapping the gate electrode with a gate insulating film interposed therebetween, and a source electrode and a drain electrode disposed on the semiconductor layer. The source electrode, the drain electrode, and the semiconductor layer are covered with a first insulating film. The gate insulating film includes a first stepped portion in a portion covering a peripheral portion of the gate electrode. The first insulating film includes a first opening at a position overlapping a portion of the first stepped portion that is not covered with the source electrode and the drain electrode in a plan view.

7 Claims, 30 Drawing Sheets

(51) Int. Cl.
*H01L 31/115* (2006.01)
*G01T 1/20* (2006.01)

(56) References Cited

U.S. PATENT DOCUMENTS

| | | | | |
|---|---|---|---|---|
| 2002/0084419 | A1* | 7/2002 | Choo | H01L 27/14676 |
| | | | | 250/370.01 |
| 2002/0154234 | A1* | 10/2002 | Moon | H01L 27/14692 |
| | | | | 348/311 |
| 2009/0073325 | A1* | 3/2009 | Kuwabara | H01L 21/76816 |
| | | | | 348/790 |
| 2009/0189231 | A1* | 7/2009 | Okada | H01L 27/14632 |
| | | | | 257/428 |
| 2010/0059804 | A1* | 3/2010 | Hayashi | H01L 27/14692 |
| | | | | 257/292 |
| 2016/0359054 | A1* | 12/2016 | Fang | H01L 29/78633 |
| 2017/0139057 | A1* | 5/2017 | Mori | H01L 29/24 |
| 2017/0148834 | A1* | 5/2017 | Tomyo | H01L 27/14665 |
| 2017/0154916 | A1* | 6/2017 | Mori | H01L 27/14687 |
| 2019/0019813 | A1* | 1/2019 | Ren | H01L 27/1225 |

\* cited by examiner

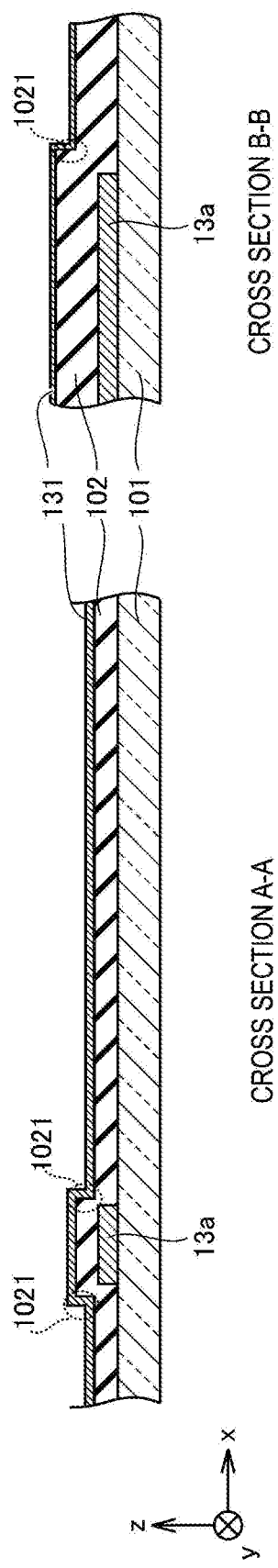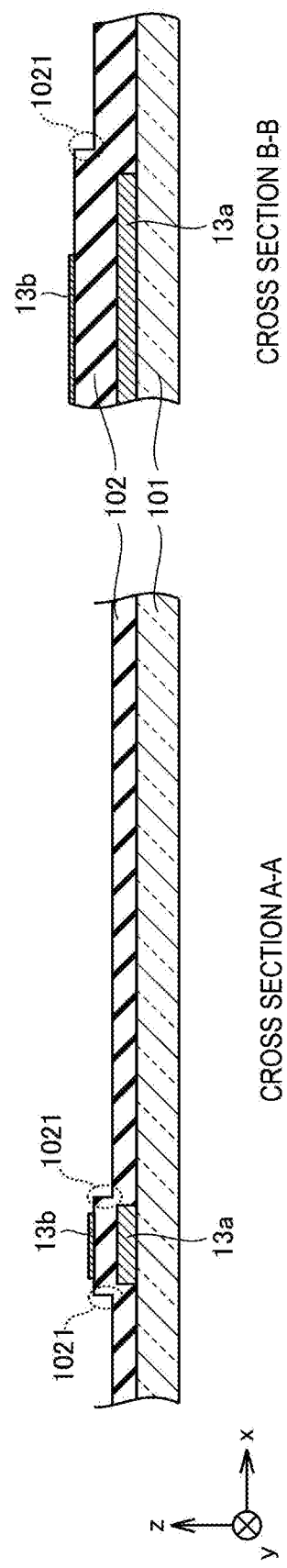
FIG. 5A
FIG. 5B

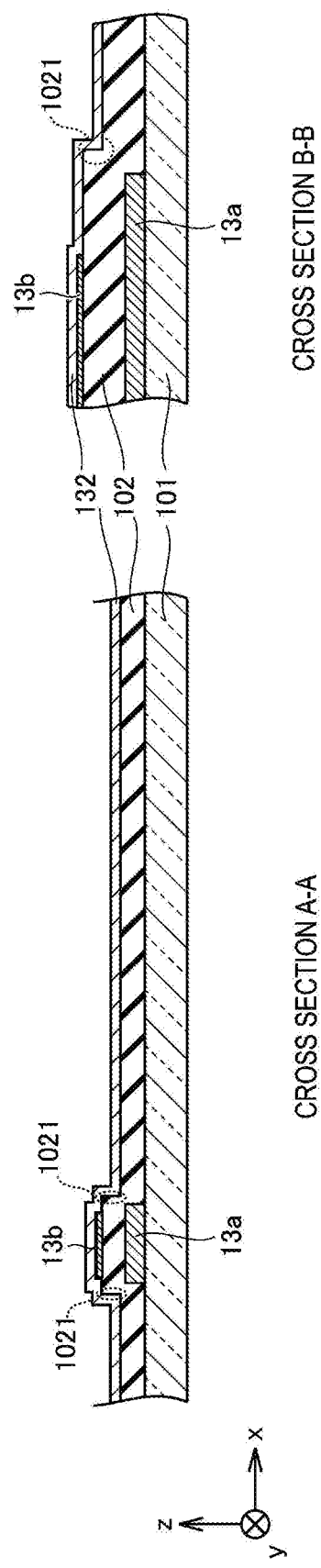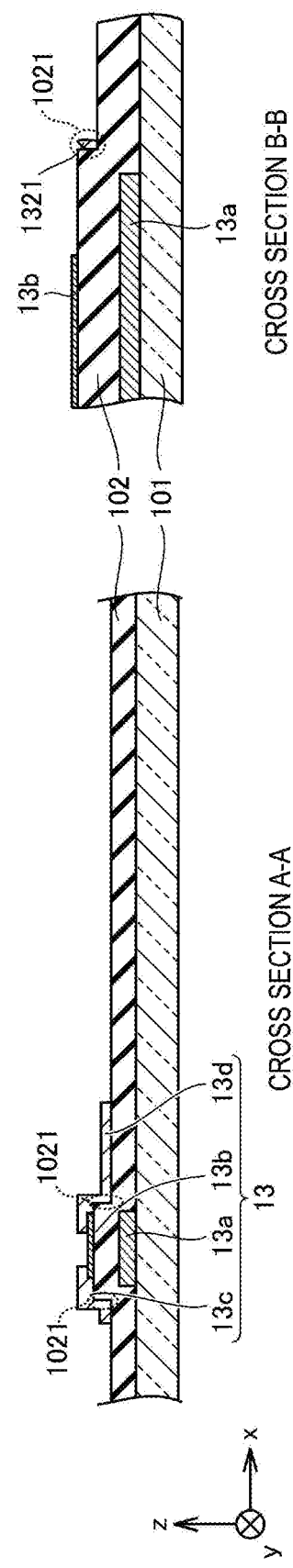
FIG. 5C
FIG. 5D

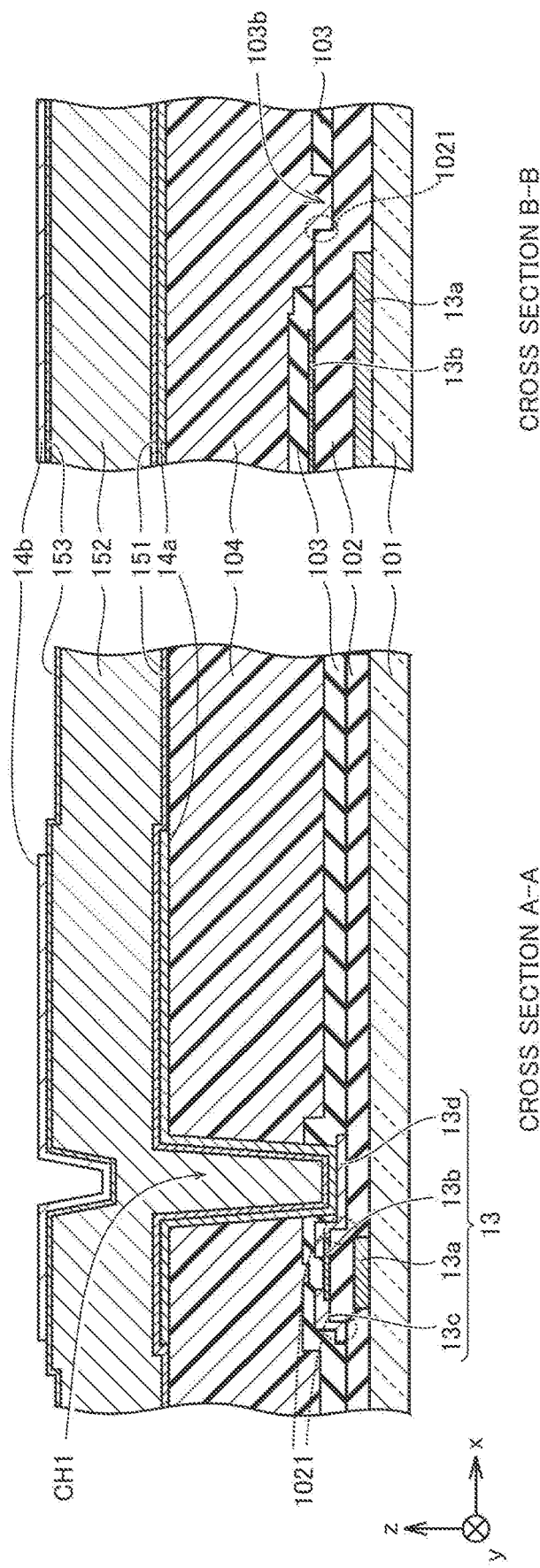

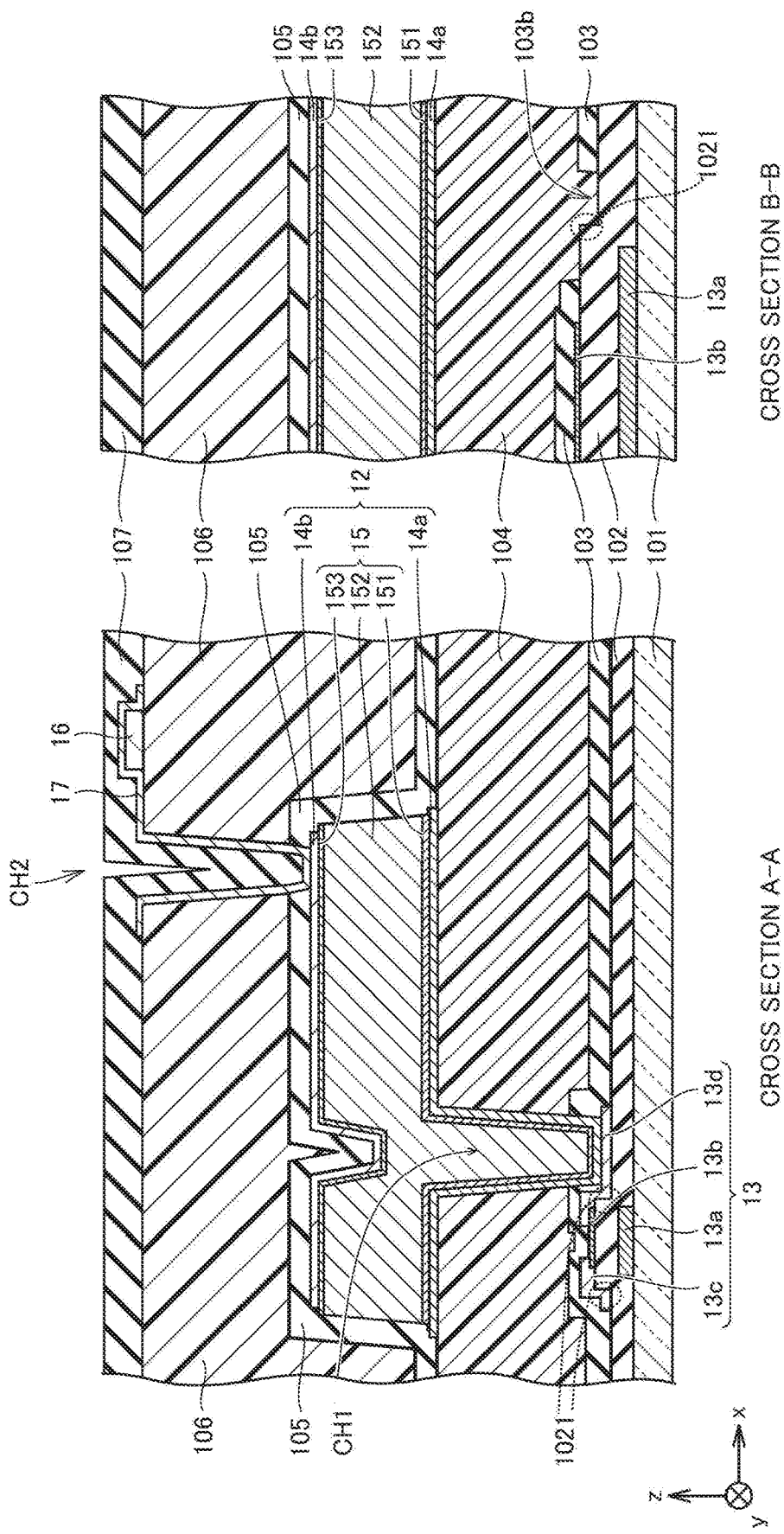

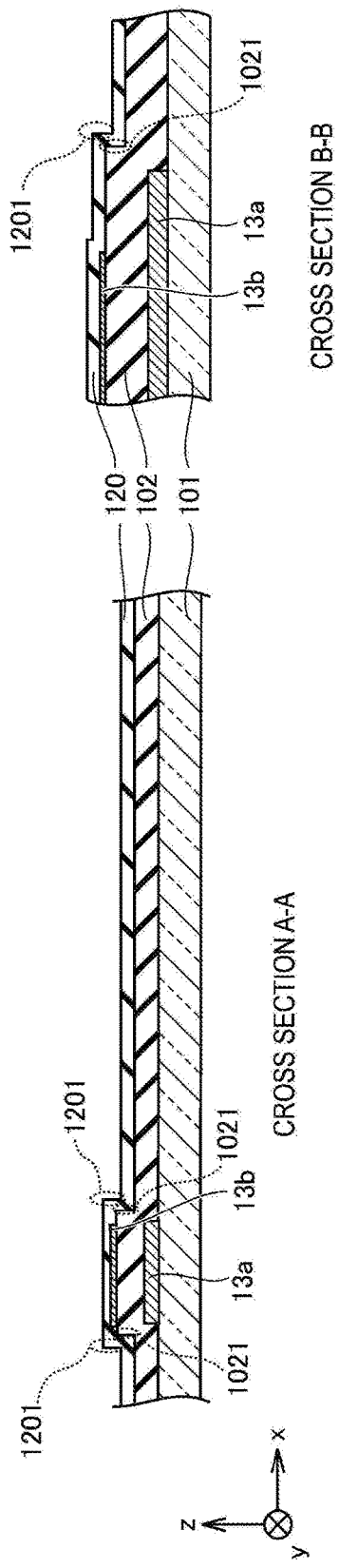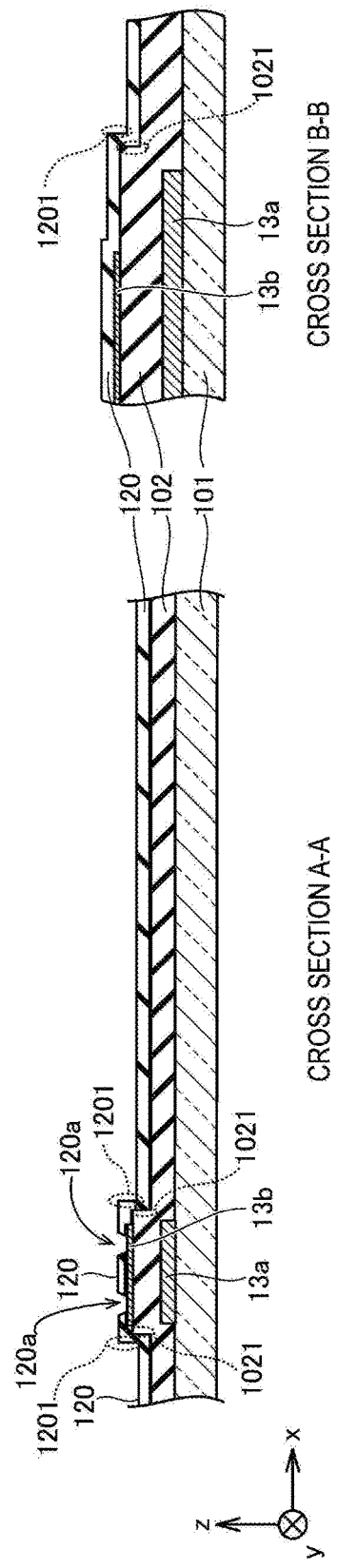

… (US 11,081,517 B2)

ACTIVE MATRIX SUBSTRATE, X-RAY IMAGING PANEL WITH THE SAME, AND METHOD OF MANUFACTURING THE SAME

CROSS-REFERENCE TO RELATED APPLICATIONS

This application claims the benefit of priority to U.S. Provisional Application No. 62/752,091 filed on Oct. 29, 2013. The entire contents of the above-identified application are hereby incorporated by reference.

BACKGROUND

Technical Field

The disclosure disclosed below relates to an active matrix substrate, an X-ray imaging panel provided with the same, and a method for manufacturing an active matrix substrate.

JP 2014-149410 A discloses a TFT array substrate in which a thin film transistor is provided in a pixel. In the TFT array substrate, a gate electrode of the thin film transistor is covered with a gate insulating film, a semiconductor film is provided overlapping the gate electrode with the gate insulating film interposed therebetween, and the source electrode and the drain electrode are separated from each other on the semiconductor film. Additionally, a pixel electrode connected to a drain electrode is provided on the TFT array substrate.

In a step of manufacturing the TFT array substrate, when the source and drain electrodes or the like are formed, if the source and drain electrodes or the like are patterned while a foreign material or the like is present on the gate insulating film, a residue of the source and drain electrodes, a semiconductor layer, or the like, may adhere to the surface of the gate insulating film. In JP 2014-149410 A, dry etching is performed to etch the surface of a gate insulating film including a residue, and this prevents a short circuit between the pixel electrode and the source wiring line.

In the case of JP 2014-149410 A, while the surface of the gate insulating film including a residue (hereinafter, an etching residue) can be etched to remove the etching residue to some extent, it is difficult to remove the etching residue completely. FIG. 9 illustrates a cross-sectional view of a region of a part of a pixel of a known active matrix substrate where the source and drain electrodes and the gate electrode of the TFT provided in the pixel do not overlap with each other in a plan view. As illustrated in FIG. 9, a gate electrode 910 formed on a substrate 900 is covered with a gate insulating film 920. A step 920a is formed in the portion of the gate insulating film 920 covering the periphery of the gate electrode 910. The step 920a is formed along the profile of the gate electrode 910. A semiconductor layer 930 is disposed on the gate insulating film 920 to overlap the gate electrode 910 in a plan view, and the semiconductor layer 930 is covered with an inorganic insulating film 940. In addition, although not illustrated in this drawing, the source and drain electrodes are formed on the gate insulating film 920 to be separated from each other on the semiconductor layer 920. As illustrated in FIG. 9, an etching residue 950 caused by etching performed when the source and drain electrodes are formed adheres to the step 920a of the gate insulating film 920 where the source and drain electrodes do not overlap the step 920a. As disclosed in JP 2014-149410 A, in a case that the surface of the gate insulating film 920 is etched through dry etching, the etching residue 950 that adheres to a wall surface portion P1 of the step 920a is less likely to be completely removed because the etching residue 950 is thicker than an etching residue 950 that adheres to a flat portion P2. As a result, there is a possibility that the source and drain electrodes may be short-circuited via the etching residue 950 adhering to the wall surface portion P1 of the step 920a.

SUMMARY

An active matrix substrate, which is made in view of the above-described problem, includes a substrate, a gate electrode disposed on the substrate, a gate insulating film covering the gate electrode, a semiconductor layer disposed on the gate insulating film and overlapping the gate electrode in plan view, a source electrode disposed on the gate insulating film and overlapping a part of the semiconductor layer, a drain electrode disposed on the gate insulating film and separated from the source electrode on the semiconductor layer, and a first insulating film covering the source electrode, the drain electrode, and the semiconductor layer, wherein the gate insulating film includes a first stepped portion in a portion covering a peripheral portion of the gate electrode when the substrate is viewed from a normal direction, and the first insulating film includes a first opening at a position overlapping a portion of the first stepped portion that is not covered with both the source electrode and the drain electrode in a plan view.

According to the above-described configuration, a short circuit between the source electrode and the drain electrode of the thin film transistor is less likely to occur.

BRIEF DESCRIPTION OF DRAWINGS

The disclosure will be described with reference to the accompanying drawings, wherein like numbers reference like elements.

FIG. 5A is a cross-sectional view illustrating a step for manufacturing the pixel of the active matrix substrate illustrated in FIG. 4, where a gate electrode and a gate insulating film are formed, and a semiconductor film forming a semiconductor active layer of the TFT illustrated in FIG. 4 is formed.

FIG. 5B is a cross-sectional view illustrating a step of patterning the semiconductor film illustrated in FIG. 5A to form the semiconductor active layer.

FIG. 5C is a cross-sectional view illustrating a step of forming a metal film as a source electrode and a drain electrode illustrated in FIG. 4.

FIG. 5D is a cross-sectional view illustrating a step of patterning the metal film illustrated in FIG. 5C to form the source electrode and the drain electrode.

FIG. 5I is a cross-sectional view illustrating a step of forming an opening of the second insulating film illustrated in FIG. 5H.

FIG. 5L is a cross-sectional view illustrating a step of forming an upper electrode (an anode electrode) after a film of the semiconductor layer is formed as a photoelectric conversion layer illustrated in FIG. 4.

FIG. 5O is a cross-sectional view illustrating a step of forming an opening of the third insulating film illustrated in FIG. 5K.

FIG. 5U is a cross-sectional view illustrating a step of forming a fifth insulating film illustrated in FIG. 4.

FIG. 7A is a cross-sectional view illustrating a step for manufacturing the pixel of the active matrix substrate illustrated in FIG. 6 and is a cross-sectional view illustrating a step of forming an inorganic insulating film as an etching stopper in FIG. 6.

FIG. 7B is a cross-sectional view illustrating a step of forming an opening (a contact hole) in the inorganic insulating film illustrated in FIG. 7A.

DESCRIPTION OF EMBODIMENTS

Figure 1:
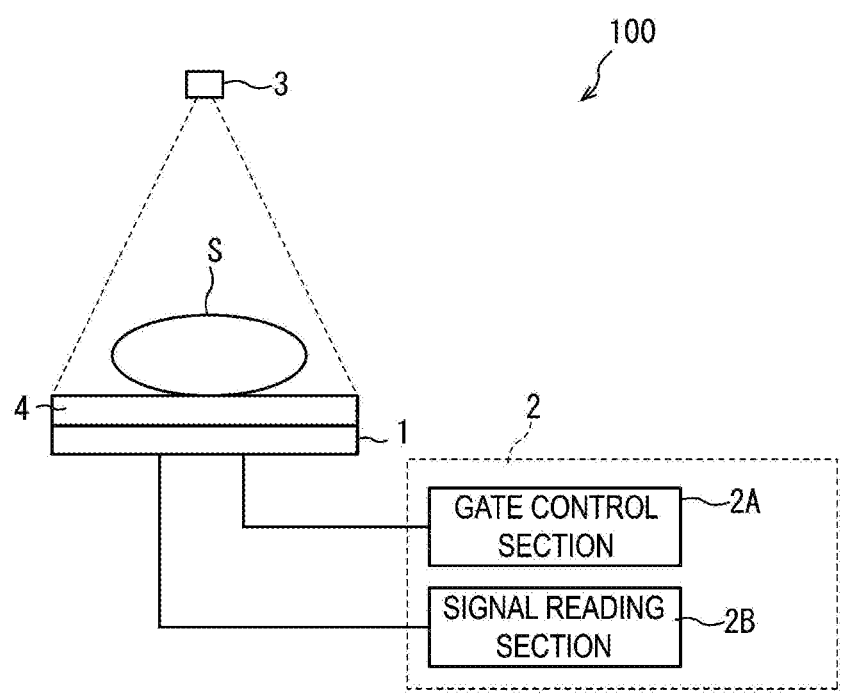
FIG. 1 is a schematic diagram illustrating an X-ray imaging device according to a first embodiment.

Hereinafter, embodiments of the present disclosure will be described in detail with reference to the accompanying drawings. In the drawings, identical or corresponding parts are denoted by the same reference signs, and the description thereof will not be repeated.

First Embodiment

Configuration

FIG. 1 is a schematic diagram illustrating an X-ray imaging device to which an active matrix substrate according to the present embodiment is applied. An X-ray imaging device 100 includes an active matrix substrate 1, a controller 2, an X-ray source 3, and a scintillator 4. In the present embodiment, an imaging panel includes at least the active matrix substrate 1 and the scintillator 4.

The controller 2 includes a gate control section 2A and a signal reading section 2B. X-rays are emitted from the X-ray source 3 to a subject S. The X-rays passing through the subject S are converted into fluorescence (hereinafter, referred to as "scintillation light") in the scintillator 4 disposed on the top of the active matrix substrate 1. The X-ray imaging device 100 acquires an X-ray image by capturing an image of the scintillation light with the active matrix substrate 1 and the controller 2.

Figure 2:
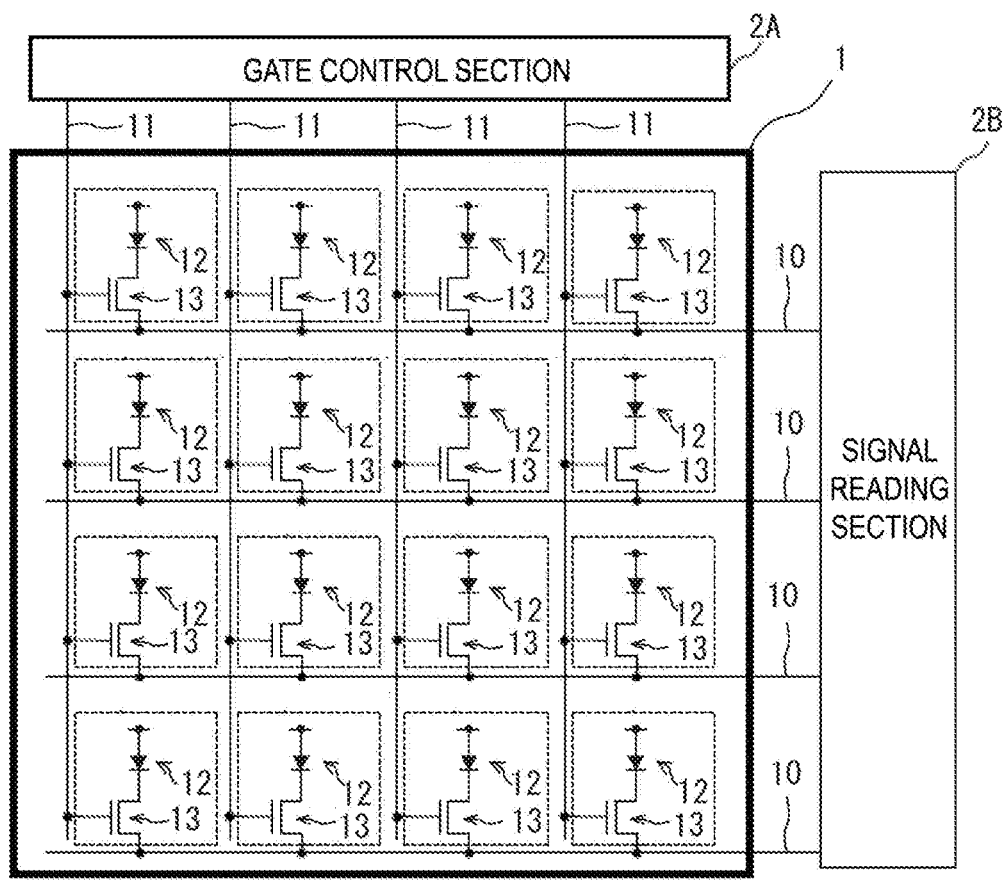
FIG. 2 is a schematic diagram illustrating a schematic configuration of an active matrix substrate illustrated in FIG. 1.

FIG. 2 is a schematic diagram illustrating a schematic configuration of the active matrix substrate 1. As illustrated in FIG. 2, a plurality of source wiring lines 10 and a plurality of gate wiring lines 11 that intersect the plurality of source wiring lines 10 are formed on the active matrix substrate 1. The gate wiring lines 11 are connected to the gate control section 2A, and the source wiring lines 10 are connected to the signal reading section 2B.

At positions at which the source wiring lines 10 and the gate wiring lines 11 intersect each other, the active matrix substrate 1 includes TFTs 13 connected to the source wiring lines 1C and the gate wiring lines 11. Photodiodes 12 are provided in regions surrounded by the source wiring lines 10 and the gate wiring lines 11 (hereinafter, pixels). In the pixels, the photodiodes 12 convert the scintillation light, which is obtained by converting the X-ray passing through the subject S, into electric charges depending on a light amount of the scintillation light.

Each of the gate wiring lines 11 is sequentially switched to a selected state by the gate control section 2A, and the TFT 13 connected to the gate wiring line 11 in the selected state turns to an on state. In a case where the TFT 13 is in the on state, a signal corresponding to the electric charge converted by the photodiode 12 is output to the signal reading section 2B via the source wiring line 10.

Figure 3:
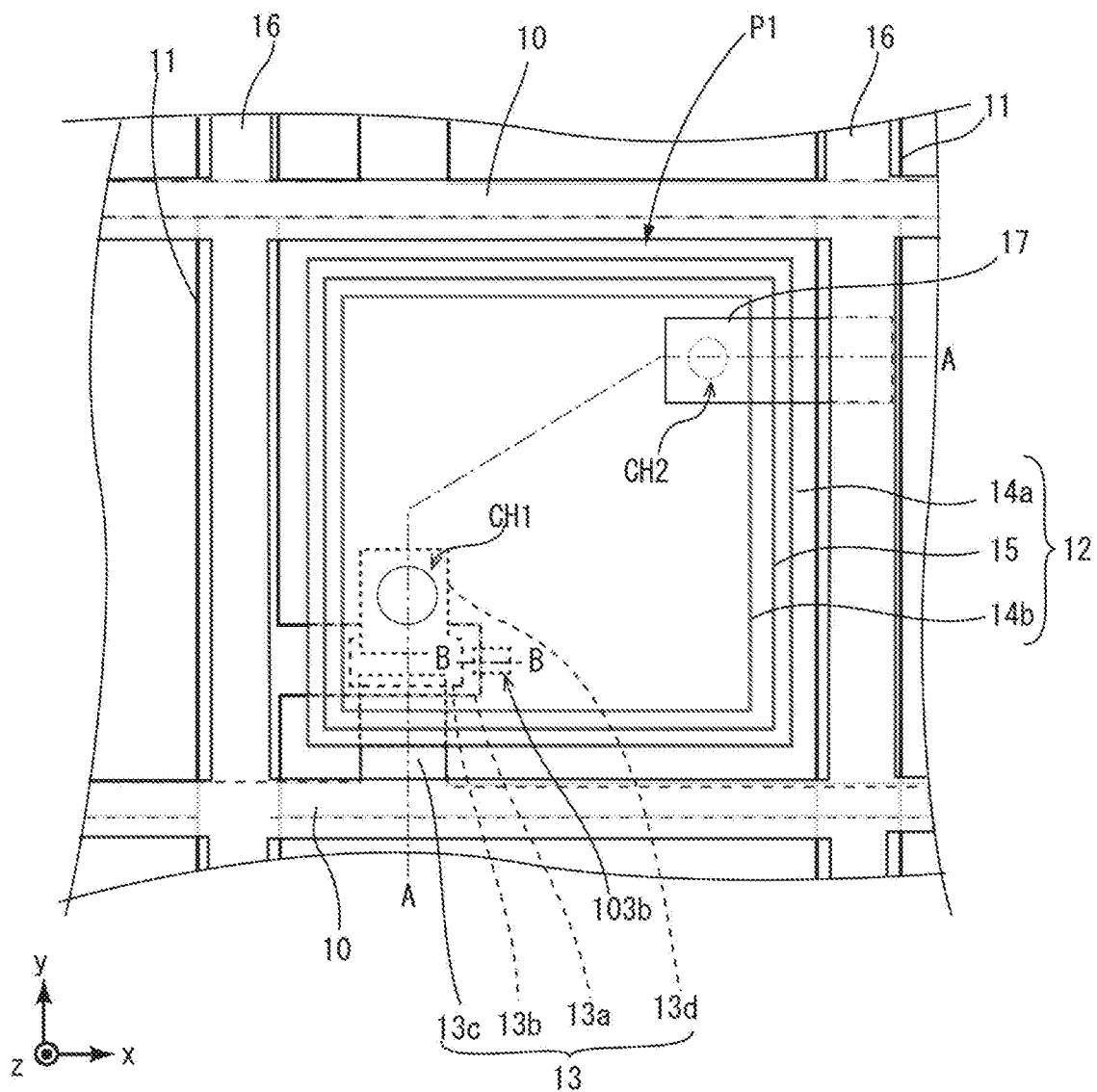
FIG. 3 is an enlarged plan view of a part of pixels of the active matrix substrate illustrated in FIG. 2.

FIG. 3 is an enlarged plan view of a part of pixels in the active matrix substrate 1 illustrated in FIG. 2.

As illustrated in FIG. 3, the photodiode 12 and the TFT 13 are provided in the pixel P1 surrounded by the gate wiring lines 11 and the source wiring lines 10.

The photodiode 12 includes a lower electrode (a cathode electrode) 14a, a photoelectric conversion layer 15, and an upper electrode (an anode•electrode) 14b. The TFT 13 includes a gate electrode 13a connected to the gate wiring line 11, a semiconductor active layer 13b, a source electrode 13c connected to the source wiring line 10, and a drain electrode 13d. The drain electrode 13d and the lower electrode 14a are connected to each other in a contact hole CH1.

Bias wiring lines 16 are arranged to overlap with the gate wiring lines 11 and the source wiring lines 10 in a plan view. The bias wiring lines 16 are connected to a transparent conductive film 17. The transparent conductive film 17 is connected to the photodiode 12 in a contact hole CH2, and a bias voltage is supplied to the upper electrode 14b of the photodiode 12.

Figure 4:
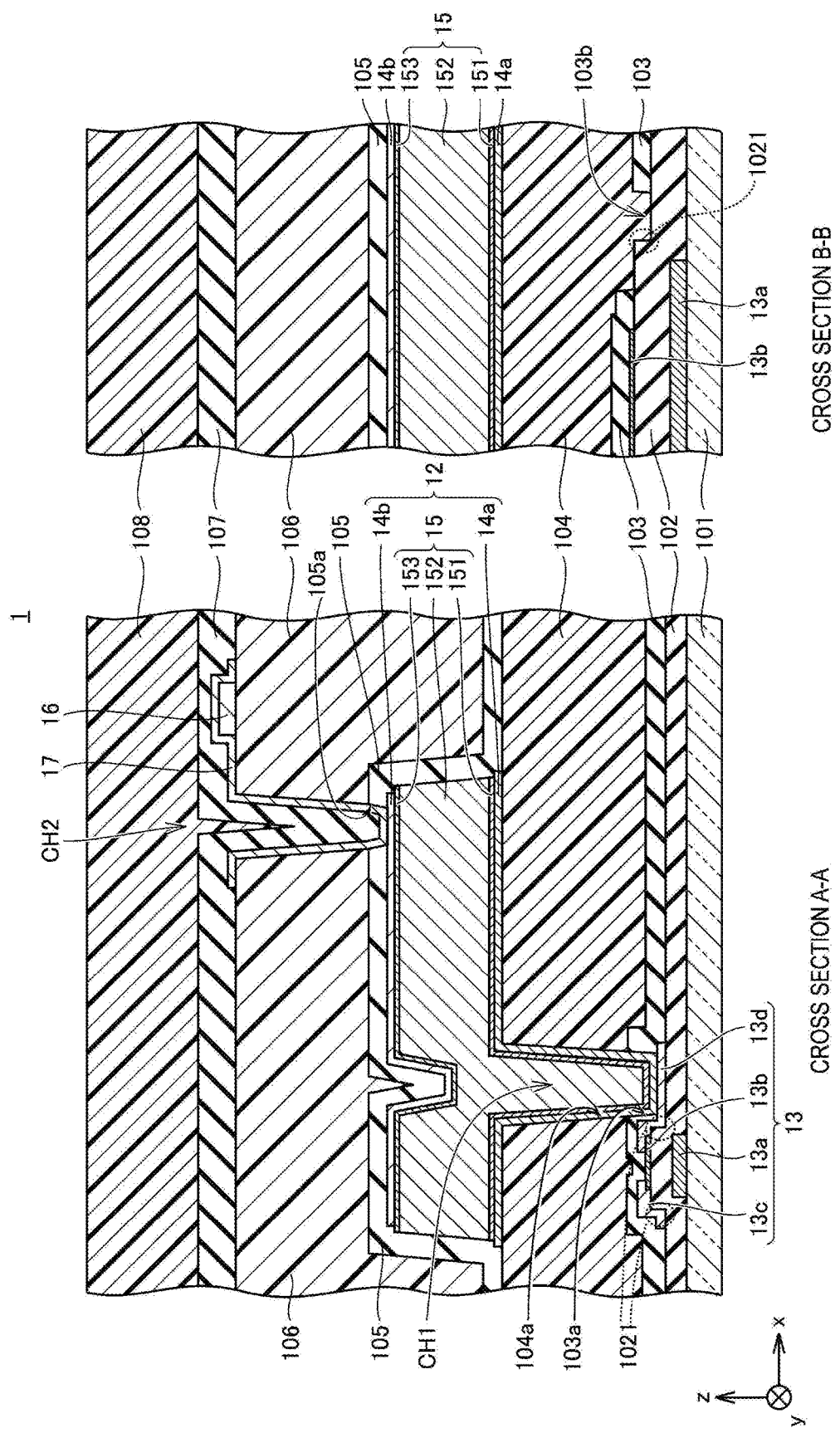
FIG. 4 is a cross-sectional view taken along a line A-A and a line B-B in the pixel of FIG. 3.

Here, FIG. 4 illustrates a cross-sectional view (a cross section A-A) taken along the line A-A in the pixel P1 and a cross-sectional view (a cross section B-B) taken along the line B-B in the pixel P1 in FIG. 3. In FIG. 4, scintillation light converted by the scintillator 4 enters from a Z-axis positive direction side of the active matrix substrate 1. Note that, in the following description, the Z-axis positive direction side may be referred to as an upper side, and a Z-axis negative direction side may be referred to as a lower side.

As illustrated in FIG. 4, the gate electrode 13a and a gate insulating film 102 are formed on a substrate 101.

The substrate 101 is a substrate having insulating properties and is constituted by, for example, a glass substrate or the like.

In this example, the gate electrode 13a is formed of the same material as that of the gate wiring line 11 (see FIG. 3), and the gate electrode 13a and the gate wiring line 11 have, for example, a structure, in which a metal film formed of aluminum (Al) and a metal film formed of molybdenum nitride (MoN) are layered. Film thicknesses of the aluminum (Al) and the molybdenum nitride (MoN) are approximately 400 nm and approximately 100 nm, respectively. Note that the materials and the film thicknesses of the gate electrode 13a and the gate wiring line 11 are not limited thereto.

The gate insulating film 102 covers the gate electrode 13a. As illustrated in the cross section A-A and the cross section B-B, the gate insulating film 102 includes a stepped portion 1021 in a portion covering the peripheral portion of the gate electrode 13a when the substrate 101 is viewed in the normal direction. Note that, in this example, the gate electrode 13a has a substantially rectangular parallelepiped shape, and the stepped portion 1021 is formed along the periphery of the gate electrode 13a.

For the gate insulating film 102, for example, silicon oxide (SiOx), silicon nitride (SiNx), silicon oxynitride (SiOxNy) (x>y), silicon nitride oxide (SiNxQy) (x>y), and the like may be used. In the present embodiment, the gate insulating film 102 has a structure in which an insulating film formed of silicon oxide (SiOx) as an upper layer and an insulating film formed of silicon nitride (SiNx) as a lower layer are layered. The film thicknesses of the silicon oxide (SiOx) and the silicon nitride (SiNx) are approximately 50 nm and approximately 400 nm, respectively. However, the material and the film thickness of the gate insulating film 102 are not limited thereto.

The semiconductor active layer 13b is disposed above the gate electrode 13a illustrated in the cross section A-A and the cross section B-B with the gate insulating film 102 interposed therebetween. In addition, as illustrated in the cross section A-A, the source electrode 13c and the drain electrode 13d separated from each other on the semiconductor active layer 13b are provided on the gate insulating film 102.

The semiconductor active layer 13b is formed in contact with the gate insulating film 102. The semiconductor active layer 13b is formed of an oxide semiconductor. For the oxide semiconductor, for example, $InGaO_3(ZnO)_5$, magnesium zinc oxide ($Mg_xZn_{1-x}O$), cadmium zinc oxide ($Cd_xZn_{1-x}O$), cadmium oxide (CdO), or an amorphous oxide semiconductor containing indium (In), gallium (Ga), and zinc (Zn) in a predetermined ratio may be used. In this example, the semiconductor active layer 13b is formed of an amorphous oxide semiconductor containing indium (In), gallium (Ga) and zinc (Zn) in a predetermined ratio. The film thickness of the semiconductor active layer 13b is approximately 70 nm. Note that the material and the film thickness of the semiconductor active layer 13b are not limited thereto.

The source electrode 13c and the drain electrode 13d are formed of the same material as that of the source wiring line 10 and, for example, have a three-layer structure in which a metal film formed of molybdenum nitride (MoN), a metal film formed of aluminum (Al), and a metal film formed of titanium (Ti) are layered. The film thicknesses of these three layers are approximately, 50 nm, 500 nm, and 100 nm in order from the lower layer side. However, the materials and the film thicknesses of the source electrode 13c and the drain electrode 13d are not limited thereto.

As illustrated in the cross section A-A, a first insulating film 103 covering the surfaces of the source electrode 13c and the drain electrode 13d and the surface of the semiconductor active layer 13b is provided on the gate insulating film 102. The first insulating film 103 includes an opening 103a that configures the contact hole CH1 on the drain electrode 13d. In addition, as illustrated in the cross section B-B, the first insulating film 103 covers the semiconductor active layer 13b and includes an opening 103b at a position overlapping the stepped portion 1021 of the gate insulating film 102 in a plan view. The first insulating film 103 is constituted by an inorganic insulating film formed of, for example, silicon nitride (SiN) and has a film thickness of approximately 330 nm.

A second insulating film 104 is provided on the first insulating film 103 illustrated in the cross section A-A and the cross section B-B. As illustrated in the cross section A-A, the second insulating film 104 includes an opening 104a on the drain electrode 13d, and the contact hole CH1 is formed by the opening 103a of the first insulating film 103 and the opening 104a of the second insulating film 104.

The second insulating film 104 is formed of, for example, an organic transparent resin such as an acrylic resin or a siloxane resin, and the film thickness thereof is approximately 2.5 μm. Note that the material and the film thickness of the second insulating film 104 are not limited thereto.

The lower electrode (the cathode electrode) 14a is provided or the second insulating film 104 illustrated in the cross section A-A and the cross section B-B. As illustrated in the cross section A-A, the lower electrode 14a and the drain electrode 13d are connected to each other in the contact hole CH1. The lower electrode 14a is constituted by, for example, a metal film including molybdenum nitride (MoN) and has a film thickness of approximately 200 nm. Note that the material and the film thickness of the lower electrode 14b are not limited thereto.

A photoelectric conversion layer 15 is provided on the lower electrode 14a illustrated in the cross section A-A and the cross section B-B. The photoelectric conversion layer 15 is formed by sequentially layering an n-type amorphous semiconductor layer 151, an intrinsic amorphous semiconductor layer 152, and a p-type amorphous semiconductor layer 153.

As illustrated in the cross section A-A, the length of the photoelectric conversion layer 15 in the X-axis direction is less than the length of the lower electrode 14a in the X-axis direction. That is, the lower electrode 14a protrudes from the side surface of the photoelectric conversion layer 15 toward an outer side of the photoelectric conversion layer 15. Note that the relationship between the lengths of the photoelectric conversion layer 15 and the lower electrode 14a in the X-axis direction is not limited thereto. The lengths of the photoelectric conversion layer 15 and the lower electrode 14a in the X-axis direction may be equal.

The n-type amorphous semiconductor layer 151 is formed of amorphous silicon doped with n-type impurities (e.g., phosphorus). As illustrated in the cross section A-A, the n-type amorphous semiconductor layer 151 is in contact with the lower electrode 14a.

The intrinsic amorphous semiconductor layer 152 is formed of intrinsic amorphous silicon. The intrinsic amorphous semiconductor layer 152 is in contact with the n-type amorphous semiconductor layer 151.

The p-type amorphous semiconductor layer 153 is formed of amorphous silicon doped with p-type impurities (for example, boron). The p-type amorphous semiconductor layer 153 is in contact with the intrinsic amorphous semiconductor layer 152.

In this example, the film thicknesses of the n-type amorphous semiconductor layer 151, the intrinsic amorphous semiconductor layer 152, and the p-type amorphous semiconductor layer 153 are approximately 30 nm, approximately 1000 nm, and approximately 5 nm, respectively. Note that the materials and the film thicknesses used for these semiconductor layers are not limited thereto.

A third insulating film 105 is provided on the second insulating film 104 illustrated in the cross section A-A and the cross section B-B. As illustrated in the cross section A-A, the third insulating film 105 includes an opening 105a at a position overlapping the photoelectric conversion layer 15 in a plan view. The third insulating film 105 covers the side surface of the photoelectric conversion layer 15 and is provided to be continuous with adjacent pixels P1. The third insulating film 105 is constituted by an inorganic insulating film formed of, for example, silicon nitride (SiN) and has a film thickness of approximately 300 nm. Note that the material and the film thickness of the third insulating film 105 are not limited thereto.

The upper electrode 14b in contact with a surface of the p-type amorphous semiconductor layer 153 and covering a part of the p-type amorphous semiconductor layer 153 is provided on the photoelectric conversion layer 15 illustrated in the cross section A-A and the cross section B-B. The upper electrode 14b is constituted by a transparent conductive film formed of Indium Tin Oxide (ITO), Indium Zinc Oxide (IZO), or the like, for example. The film thickness of the upper electrode 14b is approximately 70 nm. Note that the material and the film thickness of the upper electrode 14b are not limited thereto.

A fourth insulating film 106 covering the upper electrode 14b and the third insulating film 105 is provided above the upper electrode 14b illustrated in the cross section A-A and the cross section B-B. The fourth insulating film 106 includes the contact hole CH2 at a position overlapping the photodiode 12 in a plan view, as illustrated in the cross section A-A. The fourth insulating film 106 is formed of an organic transparent resin formed of, for example, an acrylic resin or a siloxane resin, and the film thickness is, for example, approximately 2.5 μm. Note that the material and the film thickness of the fourth insulating film 106 are not limited thereto.

As illustrated in the cross section A-A, a bias wiring line 16 and a transparent conductive film 17 connected to the bias wiring line 16 are provided on the fourth insulating film 106. The transparent conductive film 17 is in contact with the upper electrode 14b in the contact hole CH2.

The bias wiring line 16 is connected to the controller 2 (see FIG. 1). The bias wiring line 16 allows a bias voltage to be input from the controller 2 to the upper electrode 14b via the contact hole CH2.

The bias wiring line 16 has a layered structure in which, in order from the lower layer, metal films of titanium (Ti), aluminum (Al), and molybdenum nitride (MoN) are layered. The film thicknesses of the titanium (Ti), aluminum (Al), and molybdenum nitride (MoN) are approximately 50 nm, approximately 300 nm, and approximately 100 nm, respectively. However, the material and the film thickness of the bias wiring line 16 are not limited thereto.

The transparent conductive film 17 is formed of, for example, ITO and has a film thickness of approximately 70 nm. Note that the material and the film thickness of the transparent conductive film 17 are not limited thereto.

A fifth insulating film 107 is provided on the fourth insulating film 106 illustrated in the cross section A-A and the cross section B-B to cover the transparent conductive film 17 illustrated in the cross section A-A. The fifth insulating film 107 is constituted by an inorganic insulating film formed of, for example, silicon nitride (SiN), and the film thickness is, for example, approximately 200 nm. Note that the material and the film thickness of the fifth insulating film 107 are not limited thereto.

A sixth insulating film 108 covering the fifth insulating film 107 is provided on the fifth insulating film 107 illustrated in the cross section A-A and the cross section B-B. The sixth insulating film 108 is formed of an organic transparent resin formed of, for example, an acrylic resin or a siloxane resin, and the film thickness is, for example, approximately 2.0 μm. Note that the material and the film thickness of the sixth insulating film 108 are not limited thereto.

As described above, the gate insulating film 102 includes the stepped portion 1021 in a portion covering the peripheral portion of the gate electrode 13a. In a case that the stepped portion 1021 is formed, titanium (Ti) in the lowermost layer of the layered film of molybdenum nitride (MoN), aluminum (Al), and titanium (Ti), which constitutes the source electrode 13c and the drain electrode 13d, easily adheres to the wall surface of the stepped portion 1021 as an etching residue through etching performed when the source electrode 13c and the drain electrode 13d are formed.

However, in the present embodiment, the first insulating film 102 includes the opening 103a (the cross section A-A) and the opening 103b (the cross section B-B), which are formed on the drain electrode 13d and on the stepped portion 1021 of the gate insulating film 102 that is not covered with the source electrode 13c and the drain electrode 13d. For this reason, after the openings 103a and 103b of the first insulating film 103 are formed, an etching residue is exposed in the opening 103b, and the etching residue is being easily removed. In addition, while titanium (Ti) is easily etched with hydrofluoric acid, molybdenum nitride (MoN) has a greater etching resistance than that of titanium (Ti). For this reason, after forming the openings 103a and 103b, only the titanium (Ti) adhering to the stepped portion 1021 can be removed using an etchant containing hydrofluoric acid.

Although the etchant containing hydrofluoric acid is used in this example as an etchant for removing the etching residue adhering to the stepped portion 1021 of the gate insulating film 102, any etchant may be used against which the metal film of the uppermost layer of the source electrode 13c and the drain electrode 13d has an etching resistance and with which the metal film of the lowermost layer is etched easily. By selecting such an etchant, it is possible to prevent the surface of the drain electrode 13 in the opening 103a of the first insulating film 103 from being etched.

In this way, since the opening 103b of the first insulating film 103 is formed on the stepped portion 1021 of the gate insulating film 102 that is not covered with the source electrode 13c and the drain electrode 13d, only the etching residue adhering to the stepped portion 1021 is easily removed completely, and a short circuit between the source electrode 13c and the drain electrode 13d is less likely to occur.

Method for Manufacturing Active Matrix Substrate 1

Next, a method for manufacturing an active matrix substrate 1 will be described with reference to FIG. 5A to FIG. 5V. FIG. 5A to FIG. 5V illustrate cross-sectional views (the cross-section A-A and the cross section B-B in FIG. 3) illustrating steps for manufacturing the pixels P1 of the active matrix substrate 1.

Referring to FIG. 5A, the gate electrode 13a is formed on the substrate 101 by sequentially layering aluminum (Al) and molybdenum nitride (MoN) through, for example, a sputtering method and then patterning these metal films through a photolithography method. Thereafter, the gate insulating film 102 is formed by sequentially layering silicon nitride (SiN) and silicon oxide (SiO$_2$) or the substrate 101 to cover the gate electrode 13a using, for example, a plasma CVD method. At this time, the stepped portion 1021 is formed in a portion of the gate insulating film 102 covering a peripheral portion of the gate electrode 13a. Subsequently, the amorphous oxide semiconductor layer 131 containing indium (In)-gallium (Ga)-zinc (Zn)-oxygen (O) is formed on the gate insulating film 102 using, for example, a sputtering method.

Next, a photolithography method and dry etching are performed to pattern the amorphous oxide semiconductor layer 131. As a result, the semiconductor active layer 13b is formed at a position overlapping the gate electrode 13a in a plan view (see FIG. 5B).

Next, a source/drain layer 132 formed by sequentially forming films of titanium (Ti), aluminum (Al), and molybdenum nitride (MoN) is formed on the gate insulating film 102 to cover the semiconductor active layer 13b through a sputtering method (see FIG. 5C). Thereafter, a photolithography method and wet etching are performed to pattern the source/drain layer 132 (see FIG. 5D).

As a result, as illustrated in the cross section A-A in FIG. 5D, the source electrode 13c and the drain electrode 13d, which are separated from each other on the semiconductor active layer 13b, are formed. On the other hand, as illustrated in the cross section B-B in FIG. 5D, while the source/drain layer 132 on the semiconductor active layer 13b is removed, the etching residue 1321 formed of titanium (Ti) of the source/drain layer 132 that is not removed through wet etching easily adheres to the stepped portion 1021 of the gate insulating film 102. That is, the etching residue 1321 adheres to the stepped portion 1021 of the gate insulating film 102 that is not covered with the source electrode 13c and the drain electrode 13d.

Figure 5E:
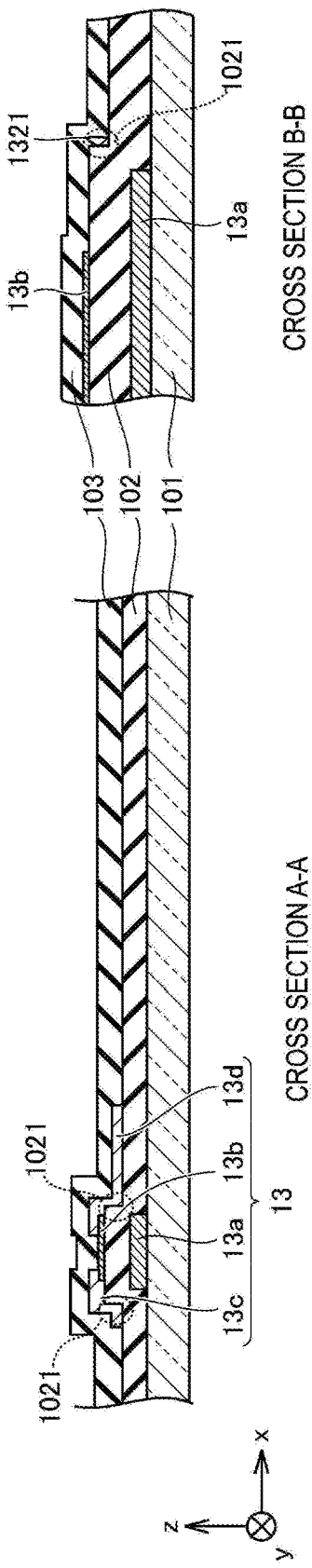
FIG. 5E is a cross-sectional view illustrating a step of forming an inorganic insulating film as a first insulating film illustrated in FIG. 4.

Thereafter, the first insulating film 103 formed of silicon nitride (SiN) is formed on the gate insulating film 102 to cover the source electrode 13c and the drain electrode 13d using, for example, a plasma CVD method (see FIG. 5E). As a result, as illustrated in the cross section B-B in FIG. 5E, the first insulating film 103 is formed on the etching residue 1321 in the stepped portion 1021 of the gate insulating film 102.

Figure 5F:
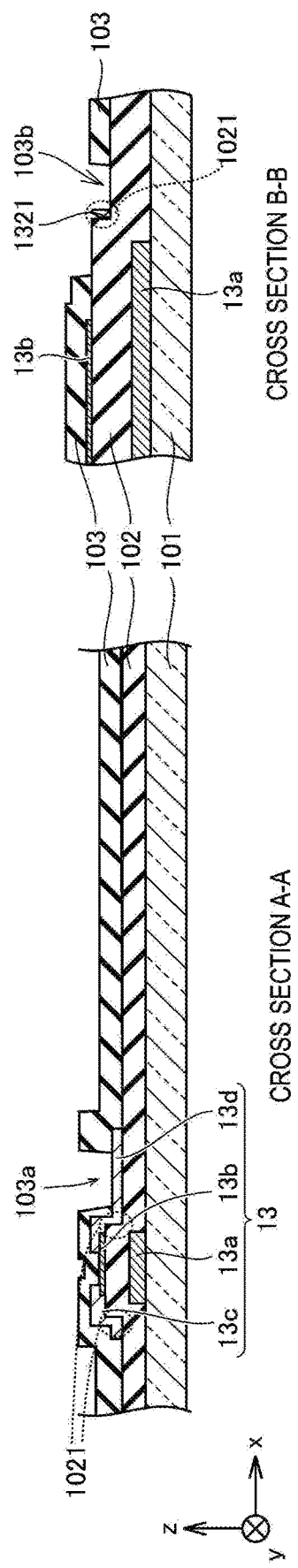
FIG. 5F is a cross-sectional view illustrating a step of patterning the inorganic insulating film illustrated in FIG. 5E to form an opening of the first insulating film.

Next, the entire surface of the substrate 101 is subjected to heat treatment at approximately 350° C., a photolithography method and dry etching using a fluorine gas are performed, and the first insulating film 103 is patterned (see FIG. 5F). As a result, as illustrated in the cross section A-A in FIG. 5F, the opening 103a of the first insulating film 103 is formed on the drain electrode 13d. In addition, as illustrated in the cross section B-B in the same drawing, the opening 103b of the first insulating film 103 is formed on the stepped portion 1021 of the gate insulating film 102. That is, the opening 103b is formed on the stepped portion 1021 of the gate insulating film 102 that is not covered with the source electrode 13c and the drain electrode 13d. As a result, the etching residue 1321 adhering to the stepped portion 1021 is exposed in the opening 103b.

Figure 5G:
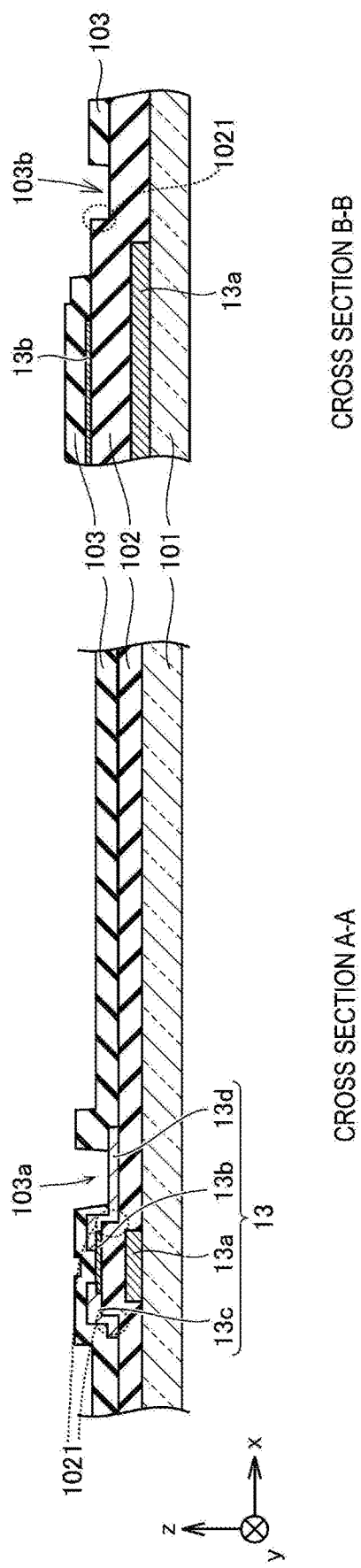
FIG. 5G is a cross-sectional view illustrating a state in which an etching residue adhering to a step in the gate insulating film illustrated in FIG. 5F is removed.

Next, wet etching using hydrofluoric acid is performed to remove the etching residue 1321 adhering to the stepped portion 1021 of the gate insulating film 102 (see FIG. 5G). As a result, as illustrated in the cross section B-B in FIG. 5G, only the etching residue 1321 formed of titanium (Ti) adhering to the stepped portion 1021 of the gate insulating film 102 is removed, and the drain electrode 13d in the opening 103a of the first insulating film 103 illustrated in the cross section A-A in the same drawing is not removed.

Figure 5H:
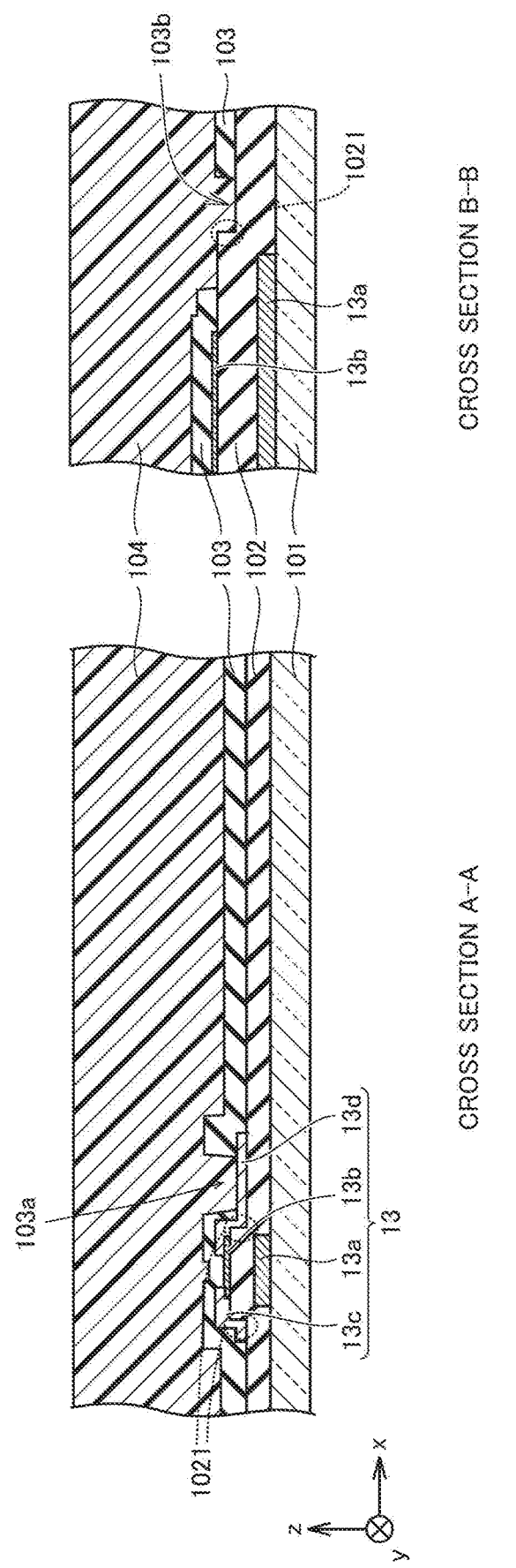
FIG. 5H is a cross-sectional view illustrating a step of forming a second insulating film illustrated in FIG. 4.
Figure 51:
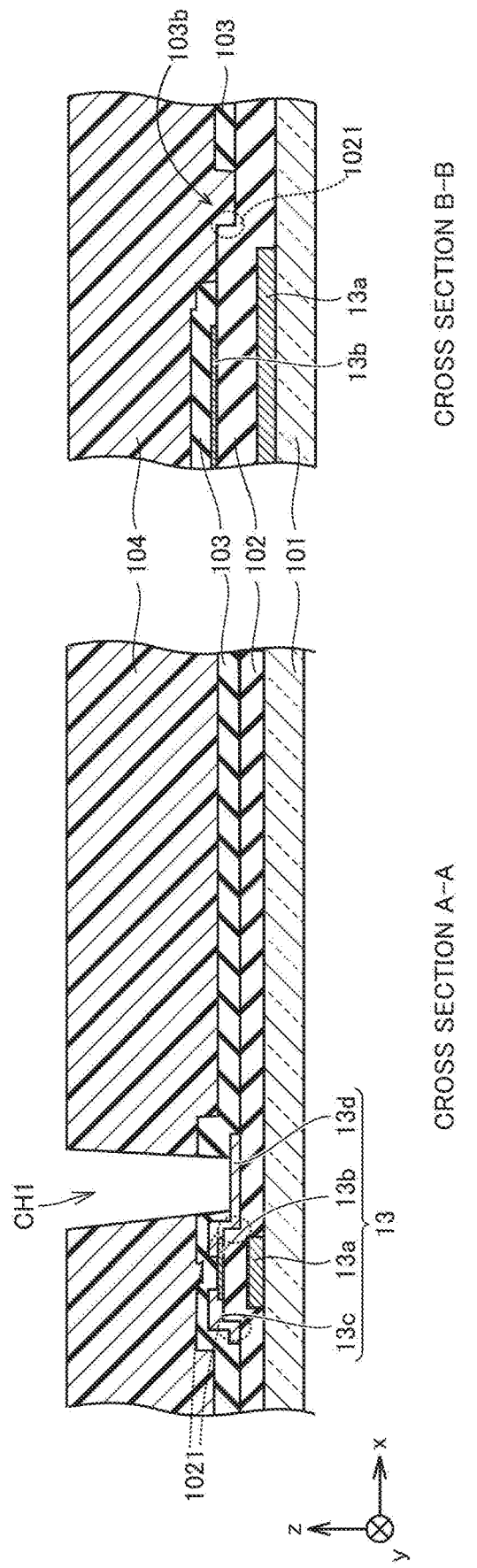

Next, the second insulating film 104 formed of an acrylic resin or a siloxane resin is formed on the first insulating film 103 by, for example, a slit coating method (see FIG. 5H). Thereafter, the second insulating film 104 is patterned using a photolithography method (see FIG. 5I). As a result, as illustrated in the cross section A-A in FIG. 5I, the opening 104a of the second insulating film 104 is formed at a position overlapping the opening 103a in a plan view, and the contact hole CH1 constituted by the openings 103a and 104a is formed.

Figure 5J:
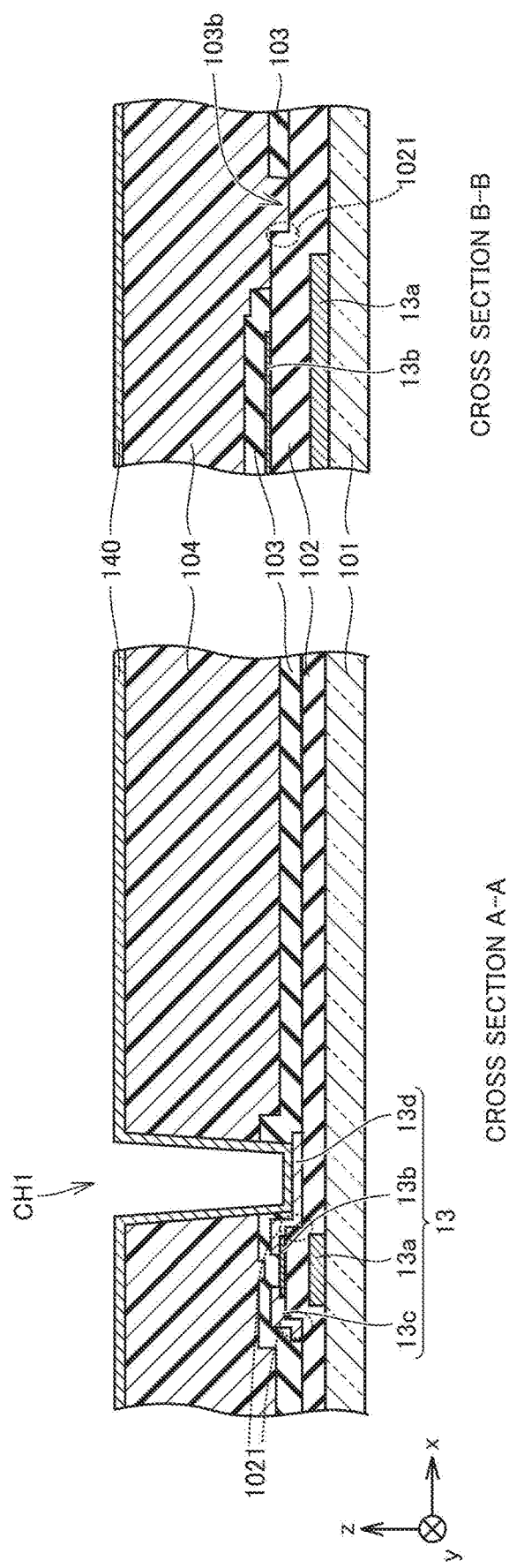
FIG. 5J is a cross-sectional view illustrating a step of forming a metal film as a lower electrode (a cathode electrode) illustrated in FIG. 4.
Figure 5K:
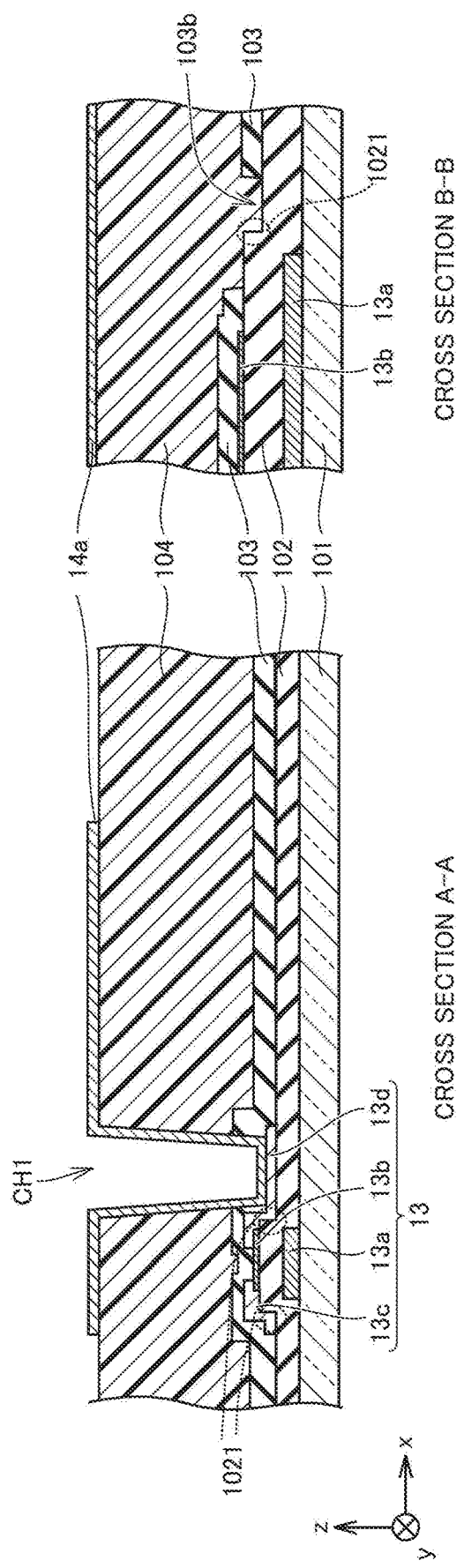
FIG. 5K is a cross-sectional view illustrating a step of patterning the metal film illustrated in FIG. 5J to form the lower electrode.

Next, the metal film 140 formed of molybdenum nitride (MoN) is formed by, for example, a sputtering method (see FIG. 5J), and then a photolithography method and wet etching are performed to pattern the metal film 140 (see FIG. 5K). As a result, as illustrated in the cross section A-A in FIG. 5K, the lower electrode 14a connected to the drain electrode 13d in the contact hole CH1 is formed.

Thereafter, the n-type amorphous semiconductor layer 151, the intrinsic amorphous semiconductor layer 152, and the p-type amorphous semiconductor layer 153 are formed in this order using, for example, a plasma CVD method. Then, a transparent conductive film formed of ITO is formed using, for example, a sputtering method, and a photolithography method and dry etching are performed to pattern the transparent conductive film (see FIG. 5L). As a result, the upper electrode 14b is formed on the p-type amorphous semiconductor layer 153.

Figure 5M:
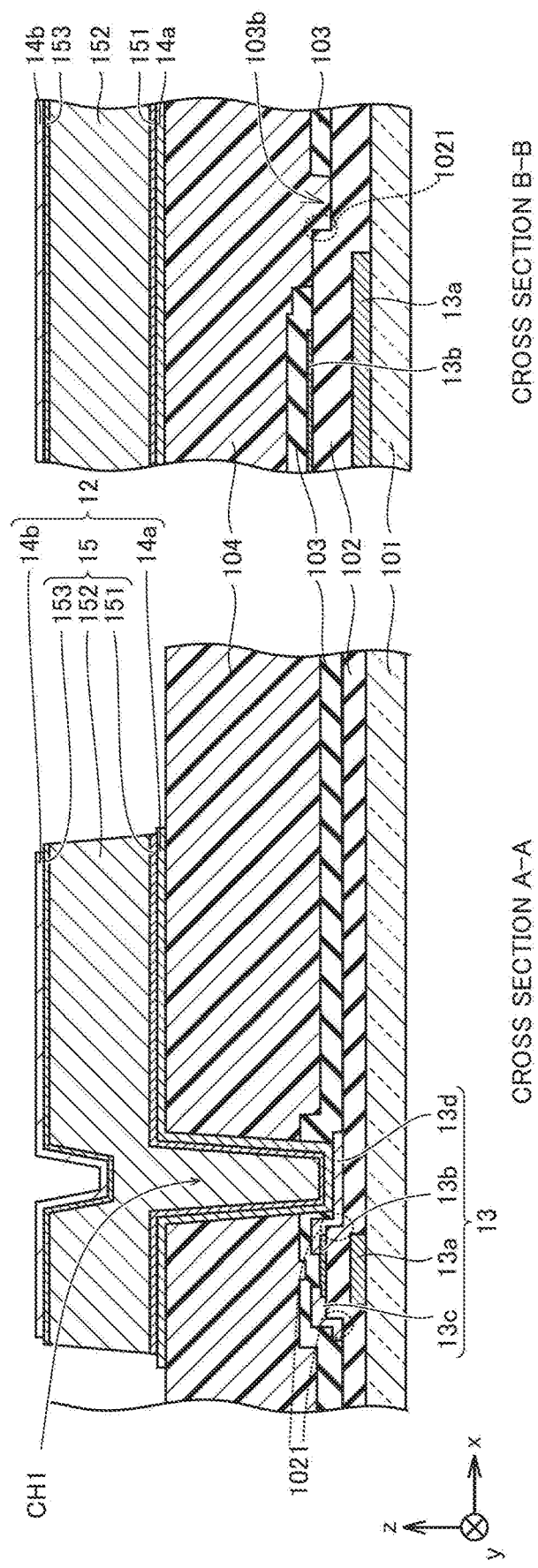
FIG. 5M is a cross-sectional view illustrating a step of patterning the semiconductor layer illustrated in FIG. 5L to form the photoelectric conversion layer.

Next, a photolithography method and dry etching are performed to pattern the n-type amorphous semiconductor layer 151, the intrinsic amorphous semiconductor layer 152, and the p-type amorphous semiconductor layer 153 (see FIG. 5M). As a result, as illustrated in the cross section A-A in FIG. 5M, the photoelectric conversion layer 15 having a length in the X-axis direction that is less than that of the lower electrode 14a and a length in the X-axis direction that is greater than that of the upper electrode 14b in a plan view is formed, and the photodiode 12 including the lower electrode 14a, the photoelectric conversion layer 15, and the upper electrode 14b is formed.

Figure 5N:
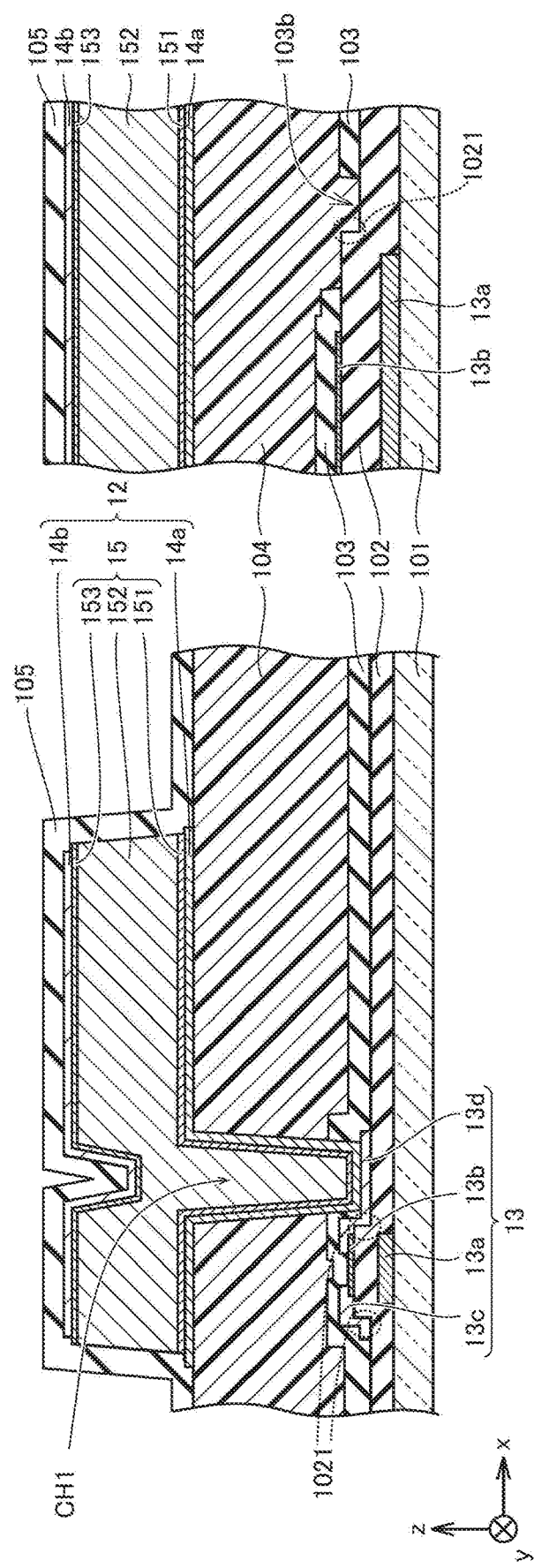
FIG. 5N is a cross-sectional view illustrating a step of forming a third insulating film illustrated in FIG. 4.
Figure 50:
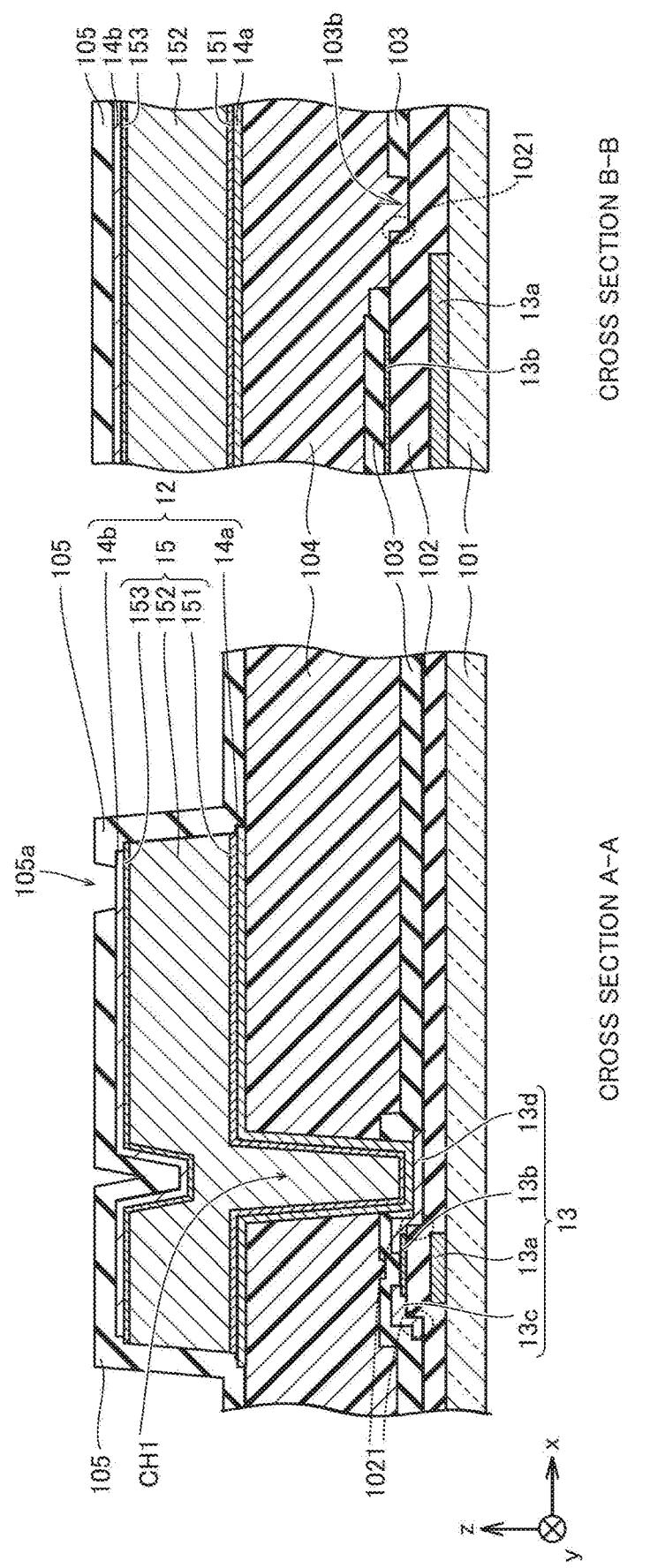

Subsequently, the third insulating film 105 formed of silicon nitride (SiN) is formed on the second insulating film 104 to cover the surface of the photodiode 12 using, for example, a plasma CVD method (see FIG. 5N). Thereafter, a photolithography method and dry etching are performed to pattern the third insulating film 105 (see FIG. 5O). As a result, as illustrated in the cross section A-A in FIG. 5O, the opening 105a of the third insulating film 105 is formed above the p-type amorphous semiconductor layer 153 of the photoelectric conversion layer 15.

Figure 5P:
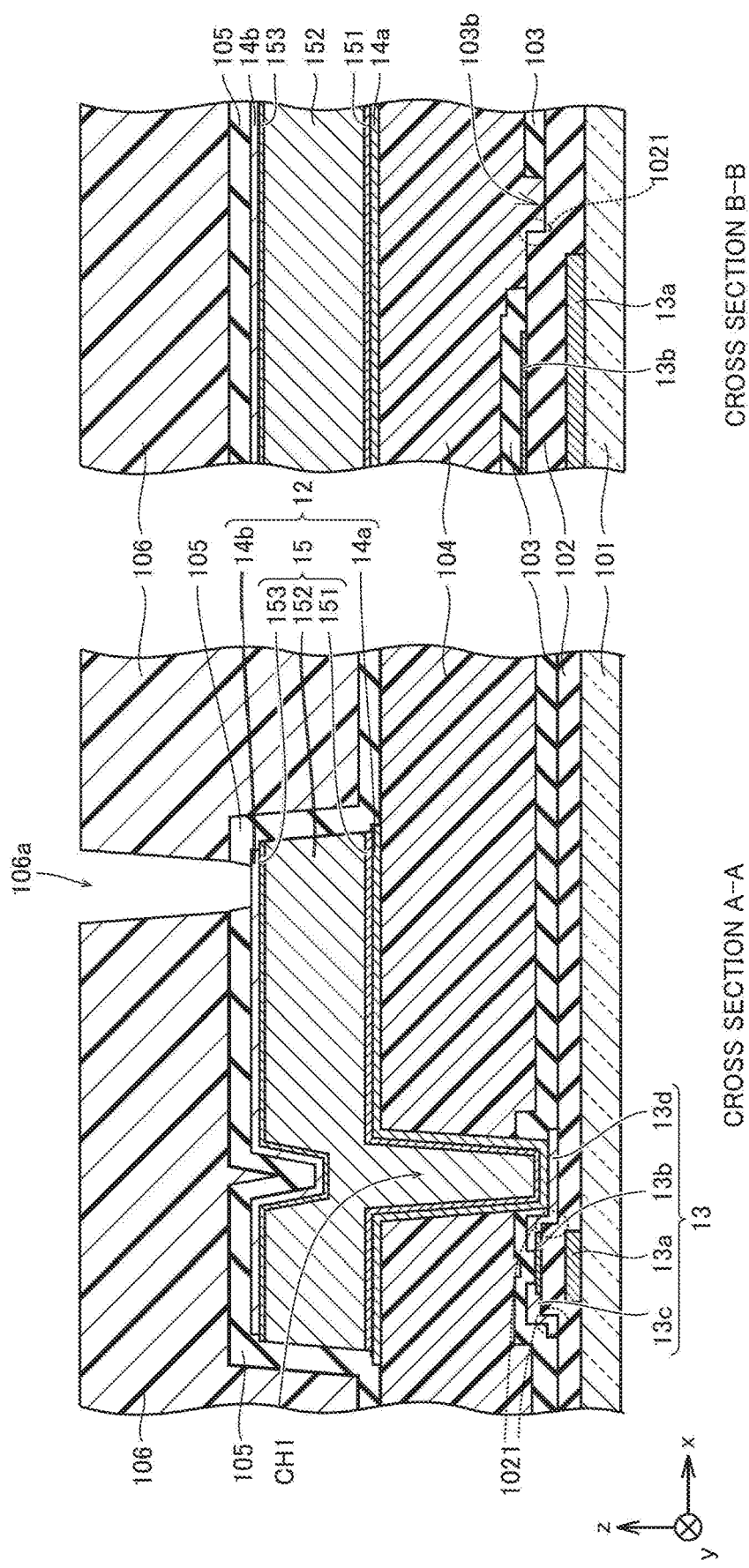
FIG. 5P is a cross-sectional view illustrating a step of forming a fourth insulating film illustrated in FIG. 4 and forming an opening of the fourth insulating film.

Next, the fourth insulating film 106 formed of an acrylic resin or a siloxane resin is formed by, for example, a slit coating method, and then the fourth insulating film 106 is patterned using a photolithography method (see FIG. 5P). As a result, as illustrated in the cross section A-A in FIG. 5P, an opening 106a of the fourth insulating film 106 is formed at a position overlapping the opening 105a of the third insulating film 105, and the contact hole CH2 constituted by the openings 105a and 106a is formed.

Figure 5Q:
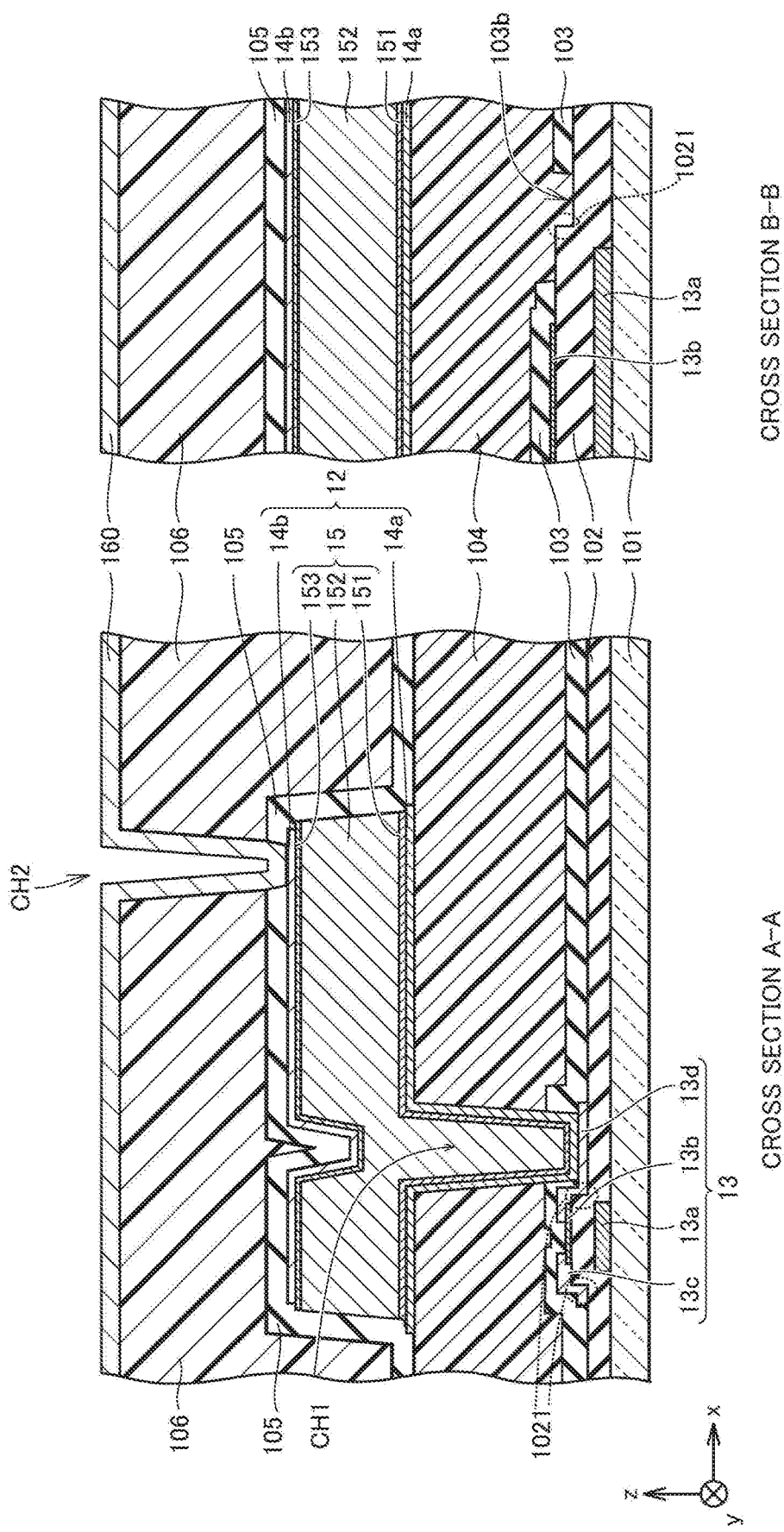
FIG. 5Q is a cross-sectional view illustrating a step of forming a metal film constituting a bias wiring line illustrated in FIG. 4.
Figure 5R:
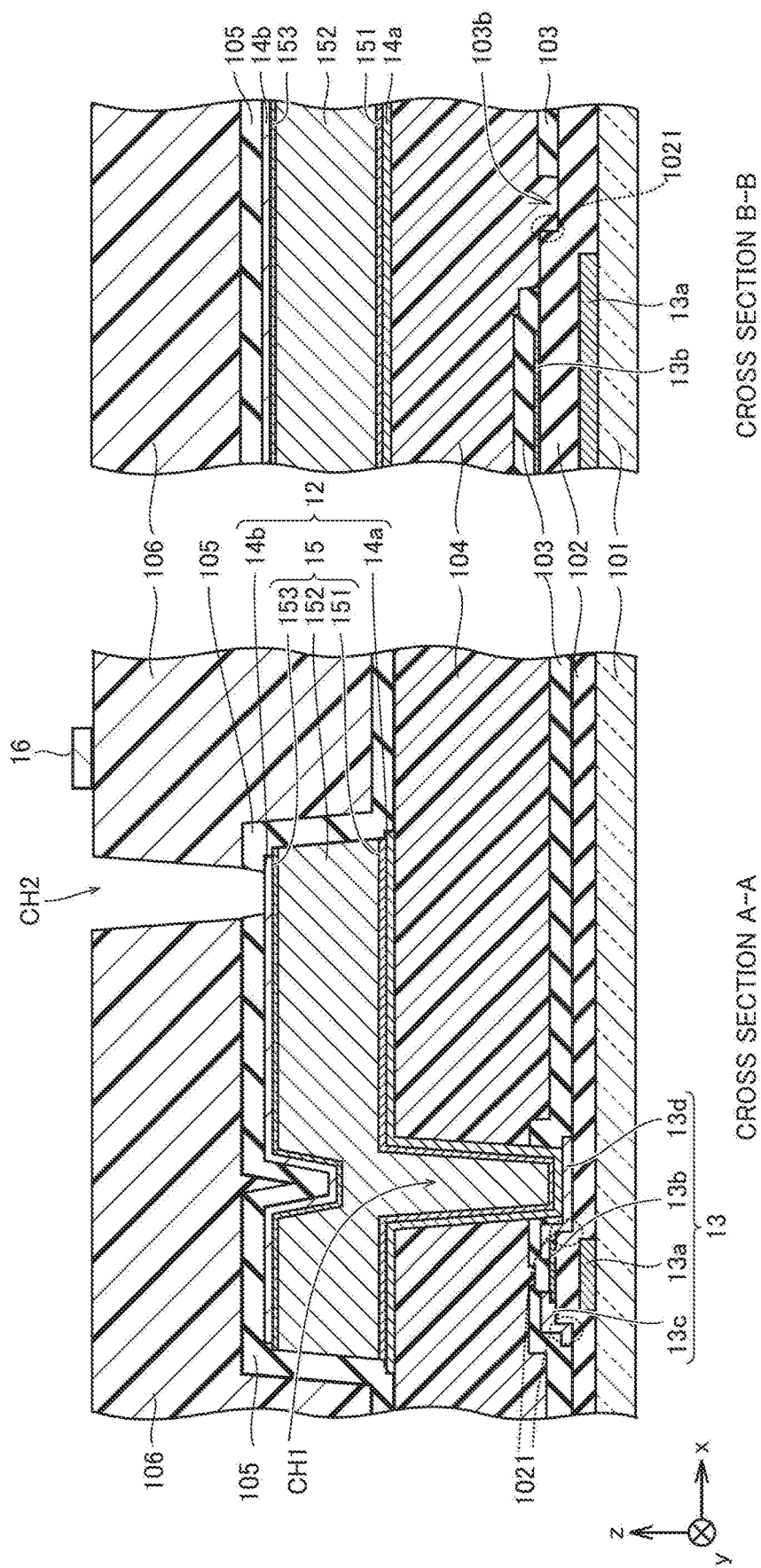
FIG. 5R is a cross-sectional view illustrating a step of patterning the metal film illustrated in FIG. 5Q to form the bias wiring line.

Next, a metal film 160 in which titanium (Ti), aluminum (Al), and molybdenum nitride (MoN) are sequentially layered is formed by, for example, a sputtering method (see FIG. 5Q). Thereafter, a photolithography method and wet etching are performed to pattern the metal film 160 (see FIG. 5R). As a result, the bias wiring line 16 is formed on the fourth insulating film 106 illustrated in cross section A-A in FIG. 5R at a position that does not overlap the photodiode 12 in a plan view, and the metal film 160 on the fourth insulating film 106 in the cross section B-B in FIG. 5R is removed.

Figure 5S:
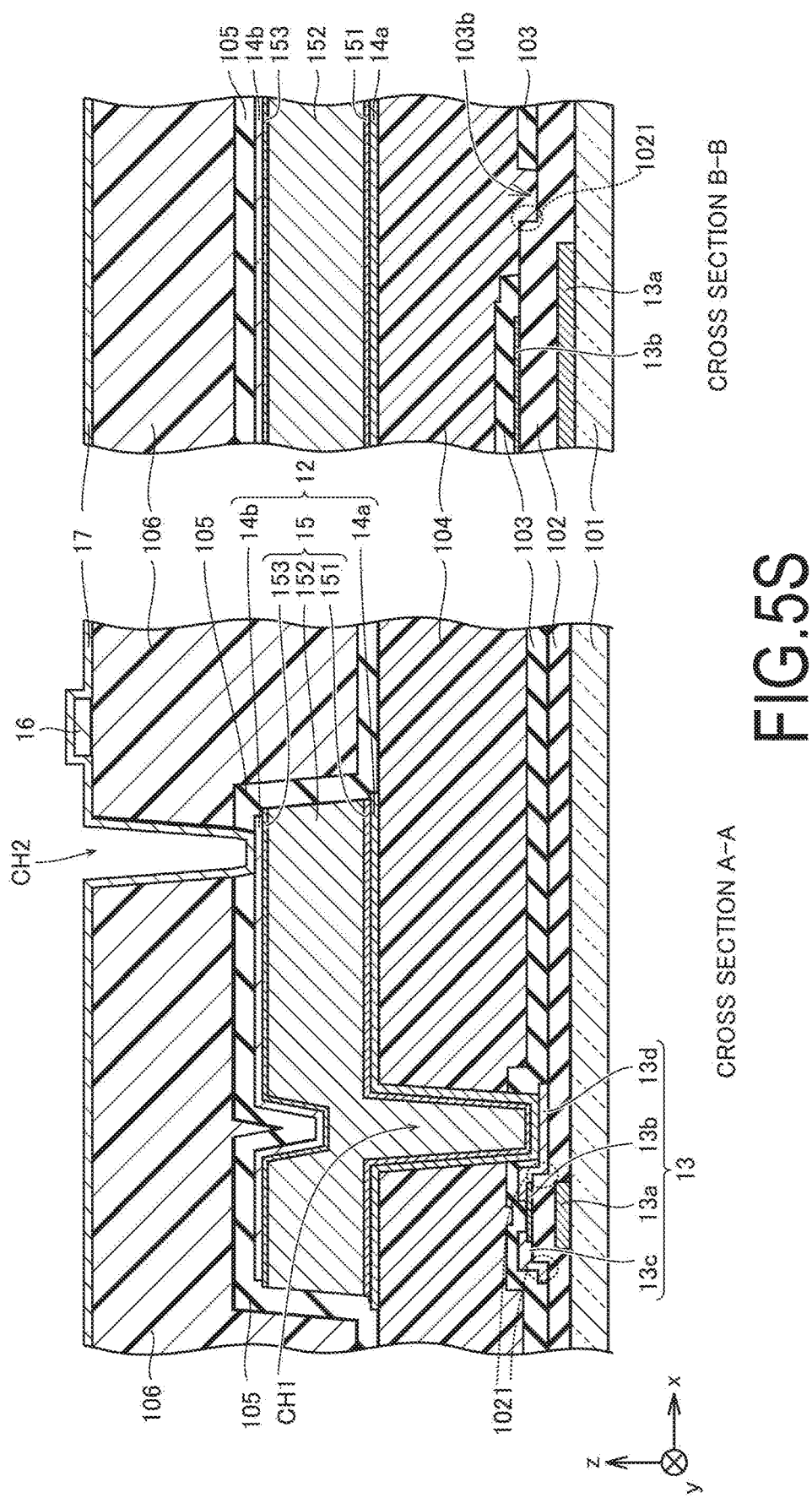
FIG. 5S is a cross-sectional view illustrating a step of forming a transparent conductive film connected to the bias wiring line and the upper electrode illustrated in FIG. 4.
Figure 5T:
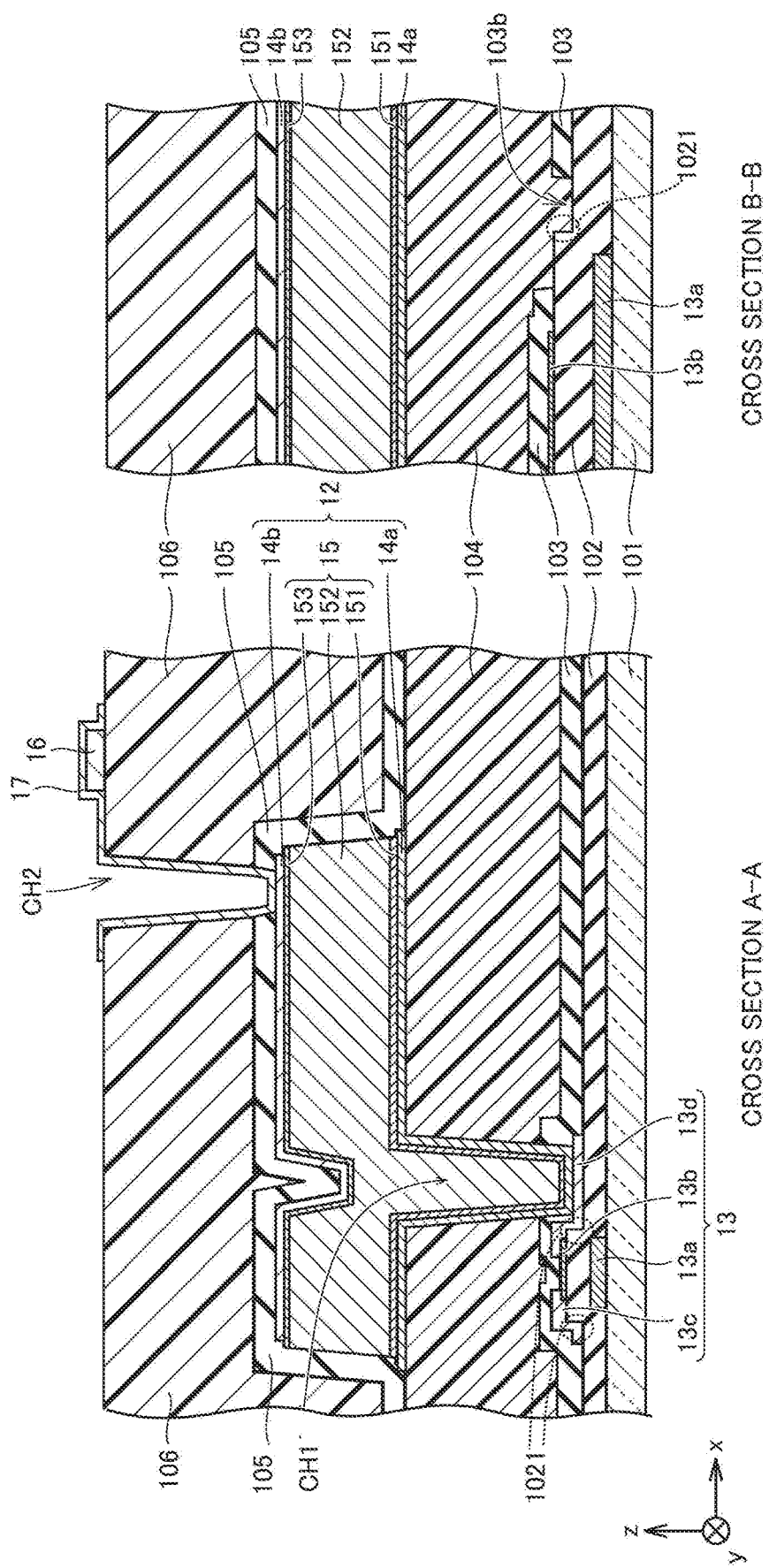
FIG. 5T is a cross-sectional view illustrating a step of patterning the transparent conductive film illustrated in FIG. 5S.
Figure 5V:
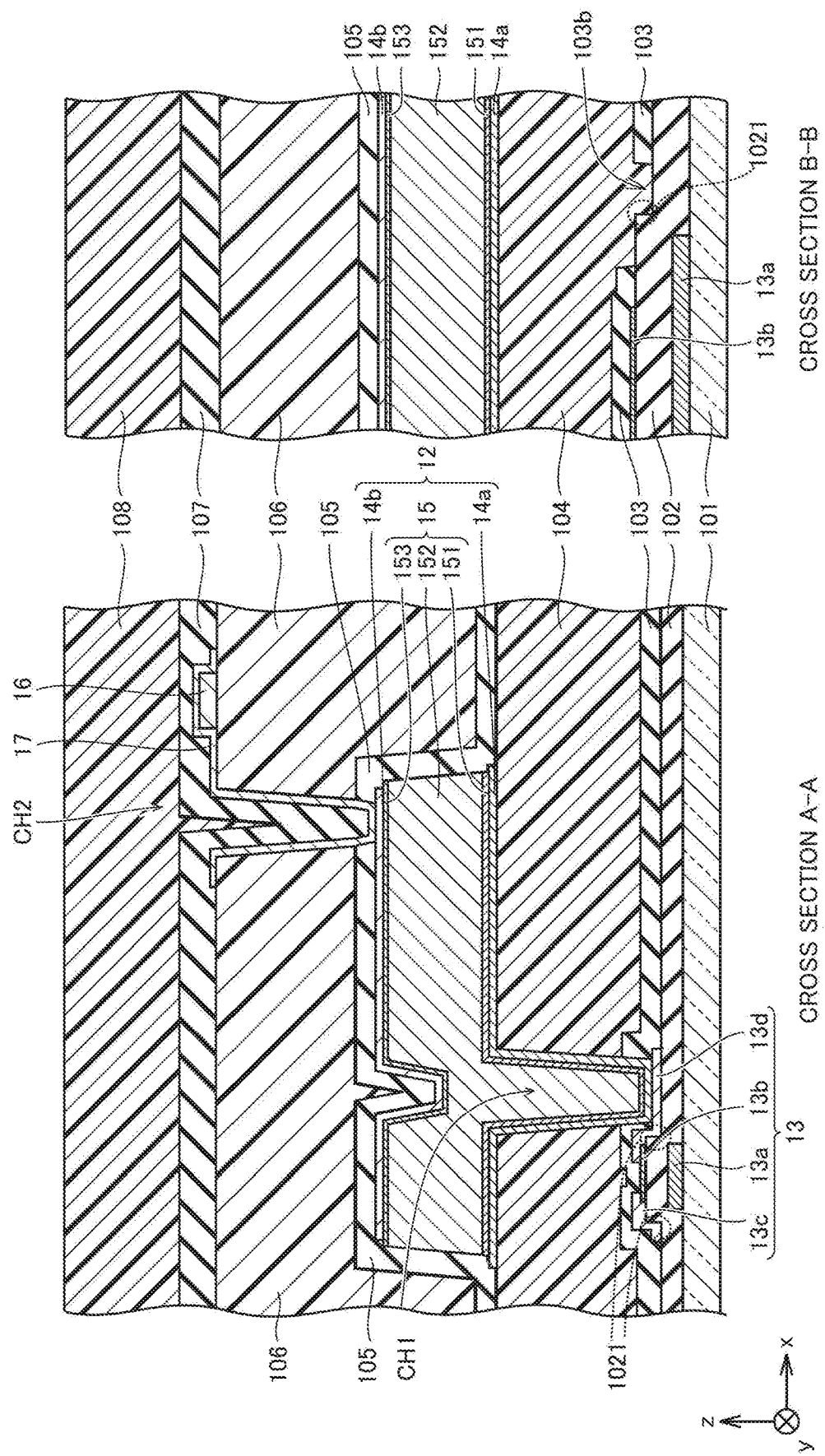
FIG. 5V is a cross-sectional view illustrating a step of forming a sixth insulating film illustrated in FIG. 4.

Next, the transparent conductive film 17 formed of ITO is formed on the fourth insulating film 106 by, for example, a sputtering method (see FIG. 5S), and then a photolithography method and dry etching are performed to pattern the transparent conductive film 17 (see FIG. 5T). As a result, the transparent conductive film 17 connected to the bias wiring line 16 and connected to the upper electrode 14b in the contact hole CH2 is formed on the fourth insulating film 106 illustrated in the cross section A-A in FIG. 5T. On the other hand, the transparent conductive film 17 on the fourth insulating film 106 illustrated in the cross section B-B in the same drawing is removed.

Next, the fifth insulating film 107 formed of silicon nitride (SiN) is formed over the entire surface of the fourth insulating film 106 to cover the transparent conductive film 17 illustrated in the cross section A-A in FIG. 5T using, for example, a plasma CVD method (see FIG. 5U).

Thereafter, the sixth insulating film 108 formed of an acrylic resin or a siloxane resin is formed to cover the fifth insulating film 107 by, for example, a slit coating method (see FIG. 5V). As a result, the active matrix substrate 1 in the present embodiment is manufactured.

As described above, in the first embodiment, the titanium (Ti) constituting the source electrode 13c and the drain electrode 13d easily adheres to the stepped portion 1021 of the gate insulating film 102, which is not covered with the source electrode 13c and the drain electrode 13d, as an etching residue. However, in the step of FIG. 5F, by forming the opening 103b of the first insulating film 103 on the stepped portion 1021, the etching residue 1321 is exposed in the opening 103b, and the etching residue 1321 is being easily etched. As a result, only the etching residue 1321 can be completely removed, and a short circuit between the source electrode 13c and the drain electrode 13d can be prevented.

Operation of X-ray Imaging Device 100

Here, the operation of the X-ray imaging device 100 illustrated in FIG. 1 will be described. First, X-rays are emitted from the X-ray source 3. At this time, the controller 2 applies a predetermined voltage (a bias voltage) to the bias wiring line 16 (see FIG. 3 and the like). The X-rays emitted from the X-ray source 3 pass through the subject S and enter the scintillator 4. The X-rays entering the scintillator 4 are converted into fluorescence (scintillation light), and the scintillation light enters the active matrix substrate 1. In a case that the scintillation light enters the photodiode 12 provided in each pixel P1 in the active matrix substrate 1, the photodiode 12 converts the scintillation light into an electric charge depending on an amount of the scintillation light. A signal corresponding to the electric charge converted by the photodiode 12 is read by the signal reading section 2B (see FIG. 2 and the like) via the source wiring line 10 in a case where the TFT 13 (see FIG. 3 and the like) is in the on state depending on a gate voltage (positive voltage) output from the gate control section 2A via the gate wiring line 11. Then, an X-ray image corresponding to the read signal is generated in the controller 2.

Second Embodiment

Figure 6:
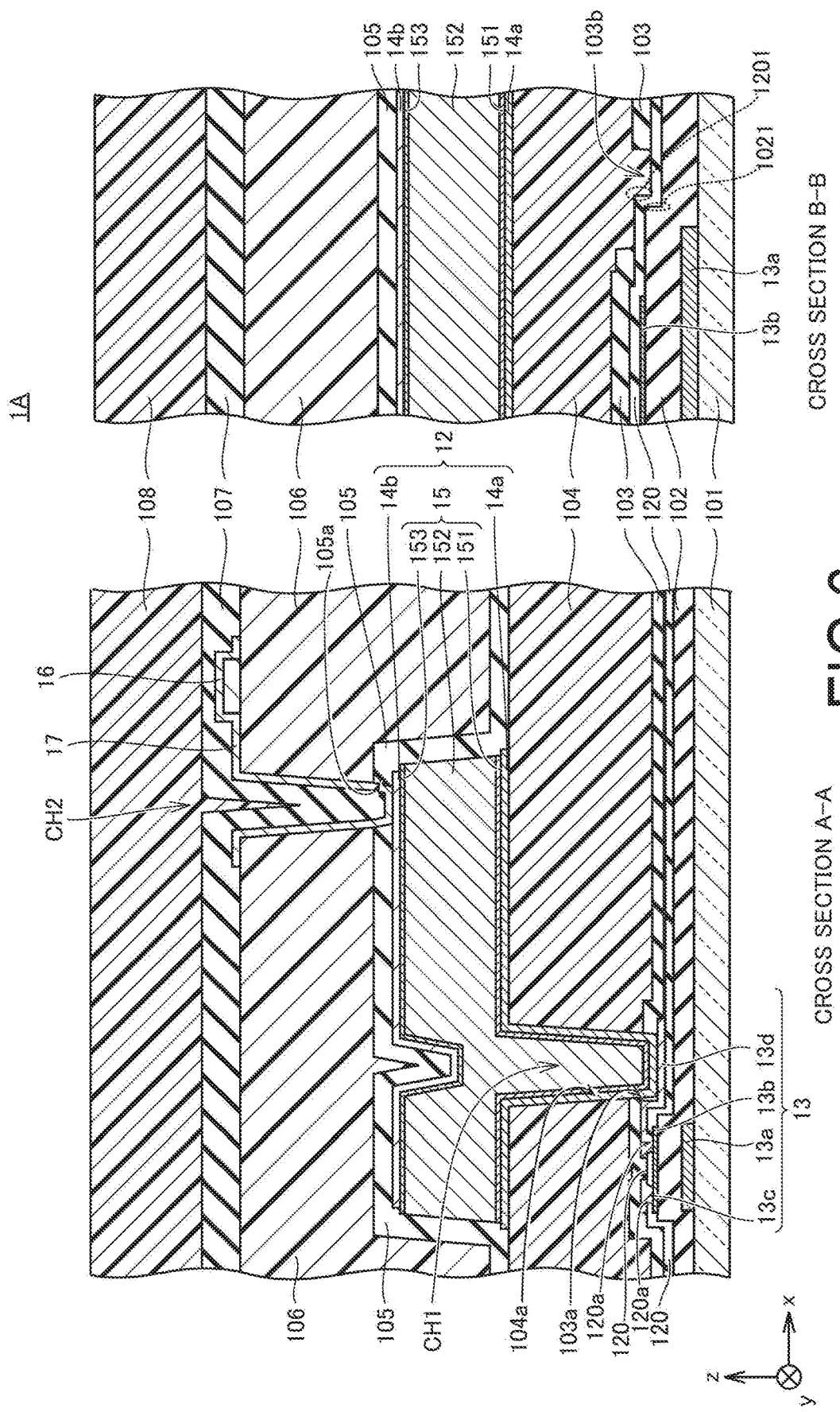
FIG. 6 is a cross-sectional view illustrating a schematic configuration of a pixel in an active matrix substrate according to a second embodiment.

FIG. 6 is a cross-sectional view illustrating a cross section A-A and a cross section B-B of a pixel P1 of an active matrix substrate 1A according to the present embodiment. In FIG. 6, components that are the same as those of the first embodiment are given the same reference signs as in the first embodiment. Hereinafter, a configuration different from the first embodiment will be described.

As illustrated in FIG. 6, the active matrix substrate 1A differs from the active matrix substrate 1 of the first embodiment in that an inorganic insulating film (an etching stopper layer) 12C covering a part of the semiconductor active layer 13b is provided on the gate insulating film 102.

As illustrated in the cross section A-A in FIG. 6, the inorganic insulating film 120 includes two contact holes 120a on the semiconductor active layer 13b and is disposed on the semiconductor active layer 13b and the gate insulating film 102. Additionally, as illustrated in the cross section B-B in the same drawing, the inorganic insulating film 120 covers the surface of the gate insulating film 102 and includes a stepped portion 1201 on a portion thereof covering the stepped portion 1021 of the gate insulating film 102. The inorganic insulating film 120 is formed of silicon oxide ($SiO_2$) or silicon nitride (SiN), for example.

Here, a method for manufacturing the active matrix substrate 1A will be described.

First, after the steps in FIGS. 5A and 5B described above are performed, as illustrated in FIG. 7A, the inorganic insulating film 120 formed of silicon nitride (SiN) is formed on the gate insulating film 102 to cover the surface of the semiconductor active layer 13b using, for example, a plasma CVD method. At this time, the stepped portion 1201 is formed at a portion of the inorganic insulating film 120 covering the stepped portion 1021 of the gate insulating film 102.

Thereafter, a photolithography method and dry etching are performed to pattern the inorganic insulating film 120 (see FIG. 7B). As a result, as illustrated in the cross section A-A in FIG. 7G, the two contact holes 120a are formed on the semiconductor active layer 13b.

Figure 7C:
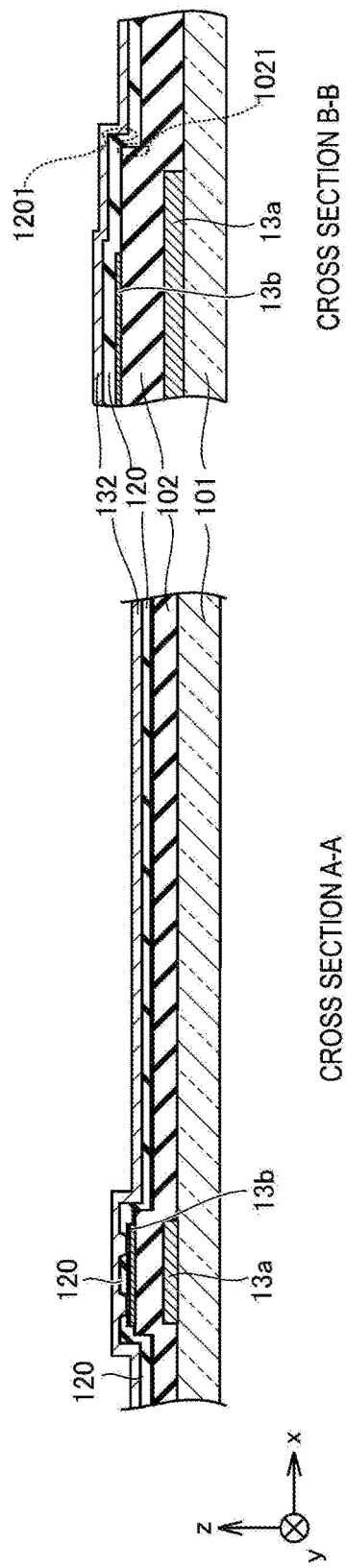
FIG. 7C is a cross-sectional view illustrating a step of forming a metal film as a source electrode and a drain electrode on the inorganic insulating film illustrated in FIG. 7B.

Next, the source/drain layer 132 in which films of titanium (Ti), aluminum (Al), and molybdenum nitride (MoN) are formed in this order is formed over the gate insulating film 102 to cover the inorganic insulating film 120 using a sputtering method (see FIG. 7C). Thereafter, a photolithography method and wet etching are performed to pattern the source/drain layer 132 (see FIG. 7D).

Figure 7D:
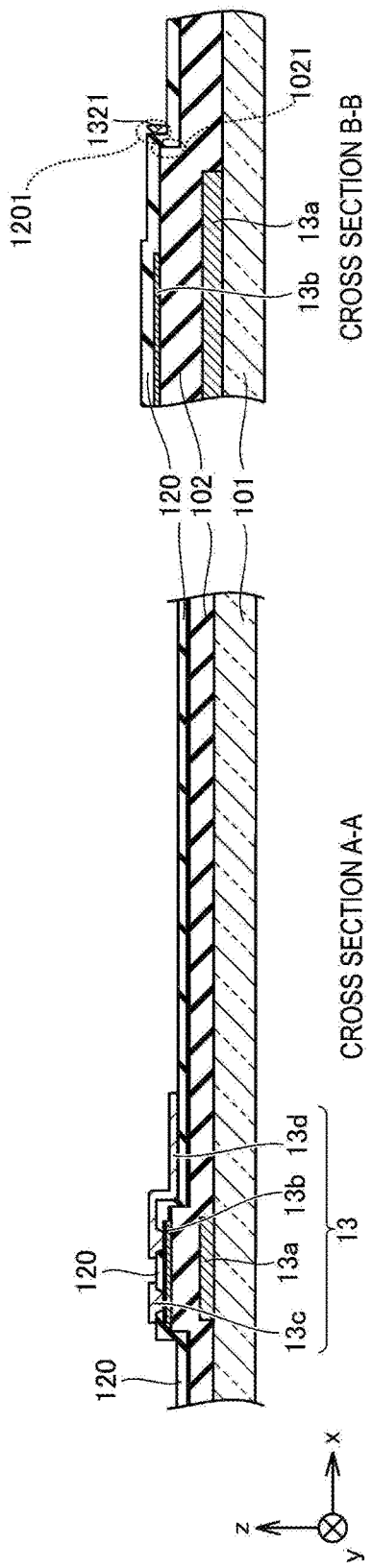
FIG. 7D is a cross-sectional view illustrating a step of patterning the metal film illustrated in FIG. 7C to form the source electrode and the drain electrode.

As a result, the source electrode 13c and the drain electrode 13d connected to the semiconductor active layer 13b in the contact holes 120a of the inorganic insulating film 120 are formed on the inorganic insulating film 120 illustrated in the cross section A-A in FIG. 7D. On the other hand, while the source/drain layer 132 on the inorganic insulating film 120 illustrated in the cross section B-B in the same drawing is removed, the titanium (Ti) of the source/drain layer 132 adheres to the stepped portion 1201 of the inorganic insulating film 120 as an etching residue 1321 that is not removed through wet etching.

Figure 7E:
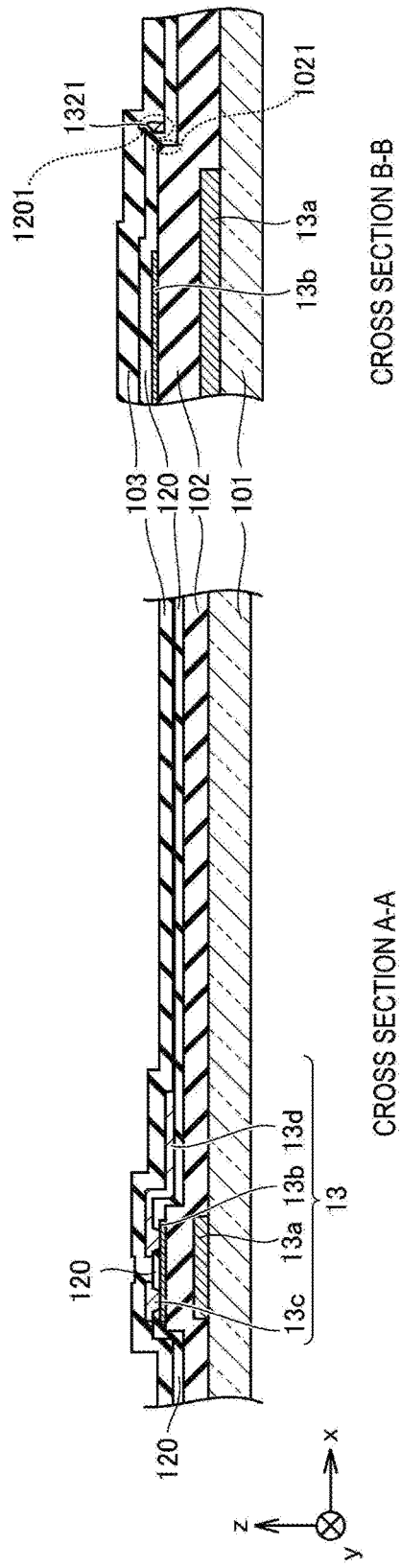
FIG. 7E is a cross-sectional view illustrating a step of forming an inorganic insulating film as a first insulating film illustrated in FIG. 6.

Next, the first insulating film 103 formed of silicon nitride (SiN) is formed on the inorganic insulating film 120 to cover the source electrode 13c and the drain electrode 13d using, for example, a plasma CVD method (see FIG. 7E). As a result, as illustrated in the cross section B-B in FIG. 7E, the first insulating film 103 is formed on the etching residue 1321 in the stepped portion 1201 of the inorganic insulating film 120.

Figure 7F:
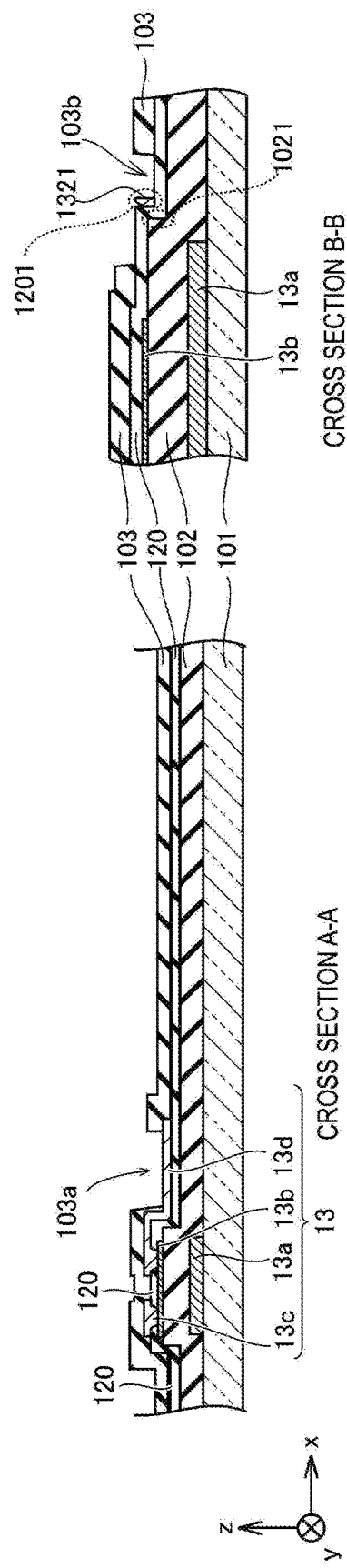
FIG. 7F is a cross-sectional view illustrating a step of patterning the inorganic insulating film illustrated in FIG. 7E to form an opening of a first insulating film.

Next, the entire surface of the substrate 101 is subjected to heat treatment at approximately 350° C., a photolithography method and dry etching using a fluorine gas are performed, and the first insulating film 103 is patterned (see FIG. 7F). As a result, as illustrated in the cross section A-A in FIG. 7F, the opening 103a of the first insulating film 103 is formed on the drain electrode 13d. Additionally, as illustrated in the cross section B-B in the same drawing, the opening 103b of the first insulating film 103 is formed on the stepped portion 1201 of the inorganic insulating film 120. As a result, the etching residue 1321 adhering to the stepped portion 1201 is exposed in the opening 103b.

Figure 7G:
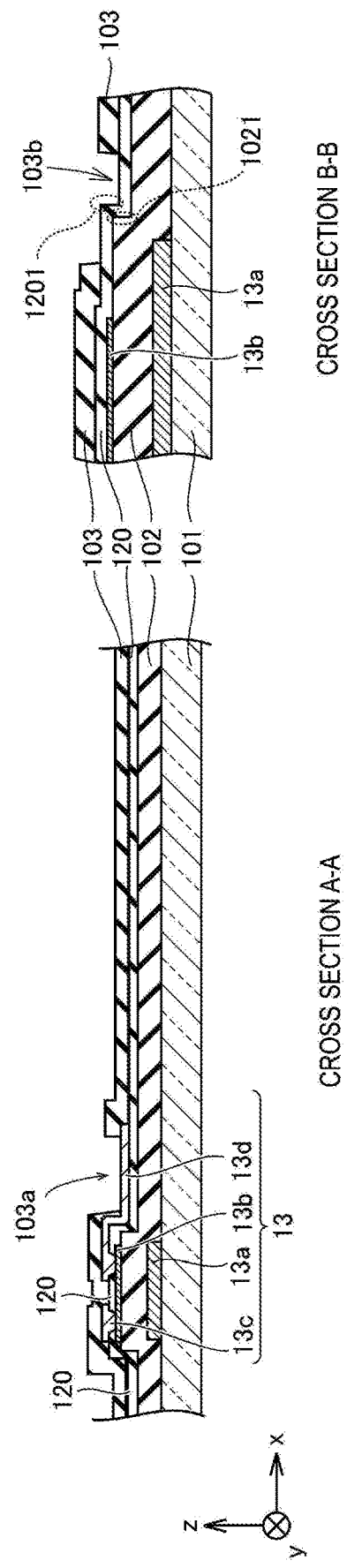
FIG. 7G is a cross-sectional view illustrating a state in which an etching residue adhering to a step of the inorganic insulating film as an etching stopper illustrated in FIG. 7F is removed.

Next, wet etching using hydrofluoric acid is performed to remove the etching residue 1321 in the stepped portion 1201 of the inorganic insulating film 120 (see FIG. 7G). As a result, as illustrated in the cross section B-B in FIG. 7G, only the etching residue 1321 adhering to the stepped portion 1201 of the inorganic insulating film 120 is removed. Note that hydrofluoric acid diluted to 0.3% is used as the etchant used herein, for example. While the inorganic insulating film 120 is slightly etched by the etchant, it is not removed by this etching because the etching selectivity thereof is greater than that of titanium (Ti). Accordingly, the provided inorganic insulating film 120 prevents the gate electrode 13a from being exposed through etching using hydrofluoric acid as compared to the first embodiment.

After the step in FIG. 7G, the active matrix substrate 1A illustrated in FIG. 6 is manufactured by performing the same steps as in FIGS. 5K to 5T described above.

While embodiments have been described above, the embodiments described above are merely exemplary. Accordingly, the active matrix substrate and the imaging panel according to the disclosure are not limited to the embodiments described above, and the embodiments described above can be appropriately modified and performed without departing from the spirit of the present disclosure.

Figure 8:
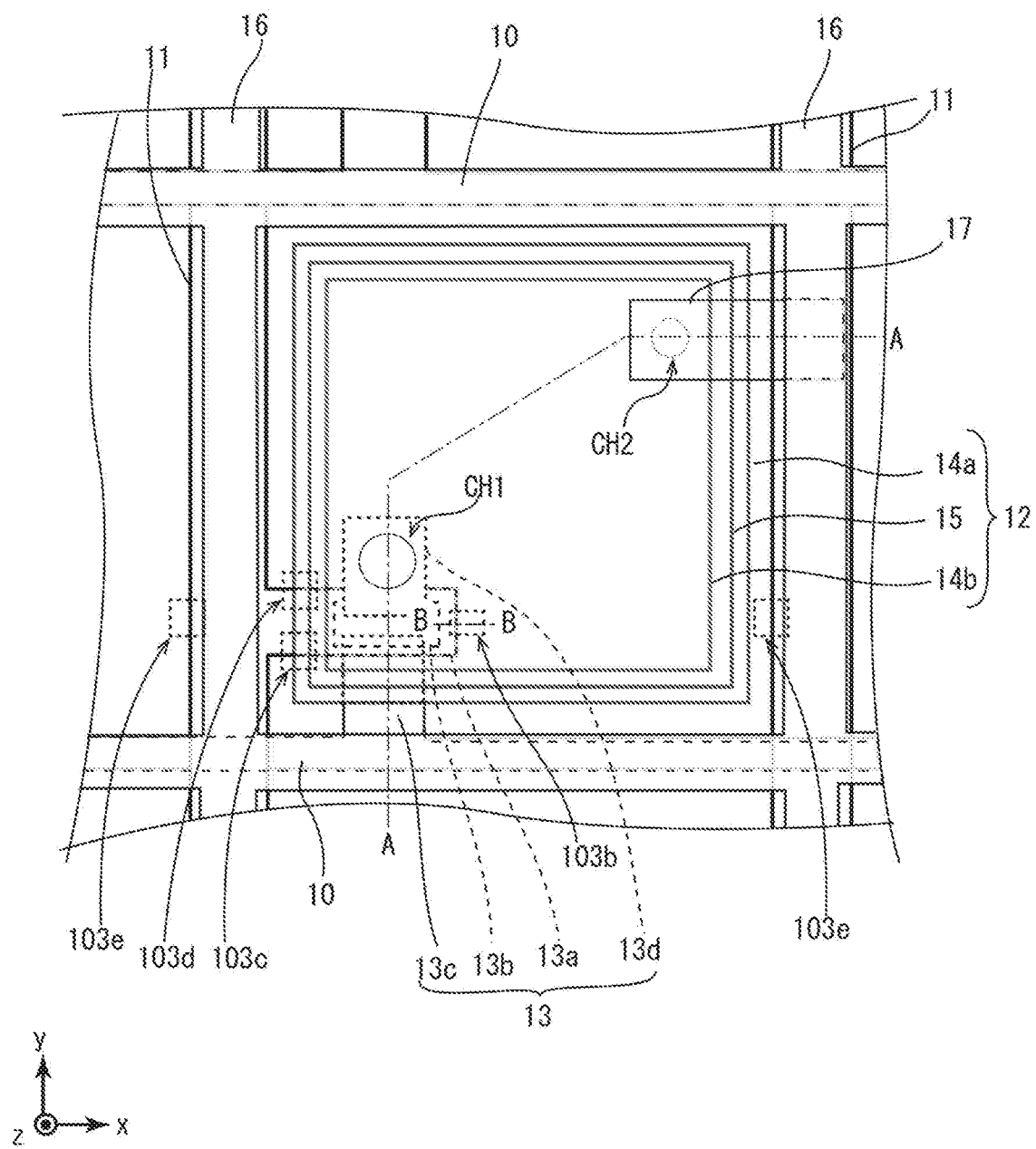
FIG. 8 is a plan view of a pixel of an active matrix substrate in Modified Example 1 and illustrating an example of a position at which an opening of a first insulating film is formed.
Figure 9:
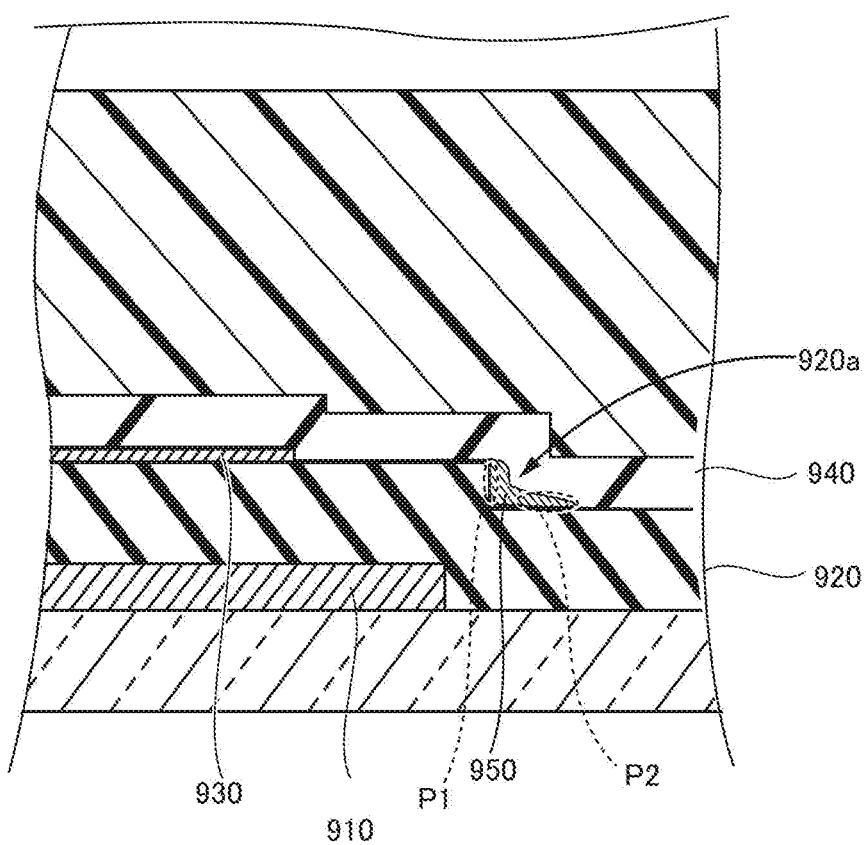
FIG. 9 is a cross-sectional view of a pixel of a known active matrix substrate and is a cross-sectional view for describing a problem in the related art.

(1) While an example in which the opening 103b of the first insulating film 103 configured to expose the etching residue is provided at one place illustrated in FIG. 3 has been described above in the first and second embodiments, the position where such an opening is formed is not limited thereto. For example, as illustrated in FIG. 8, openings 103c and 103d of the first insulating film 103 may be formed on the stepped portion 1021 (not illustrated) overlapping the peripheral portion of the gate electrode 13a that is close to one of the gate wiring lines 11 in the pixel P1 in a plan view. That is, one or more openings of the first insulating film 103 may be formed at positions overlapping the stepped portion 1021 of the gate insulating film 102 that is not covered with the source electrode 13c and the drain electrode 13d in a plan view.

In addition to the openings 103b to 103d of the first insulating film 103 described above, an opening 103e illustrated in FIG. 8 may also be formed. A step is also formed in a portion of the gate insulating film 102 covering the peripheral portion of the gate wiring line 11. In a case that an etching residue of the metal film that constitutes the source electrode 13c and the drain electrode 13d adheres to the step, the etching residue comes in contact with the source wiring line 10, and a short circuit between the adjacent source wiring lines 10 may occur via the etching residue. For this reason, an opening of the first insulating film 103 is preferably formed on the step of the gate insulating film 102 covering the peripheral portion of the gate wiring line 11 when the substrate 101 is viewed from the normal direction. Accordingly, the etching residue adhering to the step can be removed through etching using hydrofluoric acid in the step of FIG. 7G.

(2) While an example in which the source/drain layer 132 has a three-layer structure has been described in the above embodiments, the structure of the source/drain layer 132 is not limited thereto. The source/drain layer 132 may have a two-layer structure in which, for example, titanium (Ti) as the lower layer and aluminum (Al) as the upper layer are layered. In addition, the source/drain layer 132 may have a four-layer structure in which, for example, films of titanium (Ti), molybdenum nitride (MoN), aluminum (Al), and molybdenum nitride (MoN) are formed in this order. In this case, the three layers other than the titanium (Ti) layer, that is, the aluminum (Al) and molybdenum nitride (MoN) layers of the source/drain layer 132 are wet-etched using a mixed acid etchant including phosphoric acid, nitric acid, and acetic acid. In addition, the source/drain layer 132 may be constituted by, for example, a single layer of titanium (Ti). In this case, the source/drain layer 132 is dry-etched using a chlorine-based gas. In other words, the source/drain layer 132 needs only have a structure in which the metal film on the surface of the drain electrode 13d exposed in the opening 103a of the first insulating film 103 has a greater etching resistance against the etchant used when the etching residue 1221 is removed, than that of the metal film on the lower layer side.

The active matrix substrate described above, an imaging panel provided with the same, and a method for manufacturing the active matrix substrate can be described as follows.

An active matrix substrate according to a first configuration includes a substrate, a gate electrode disposed on the substrate, a gate insulating film covering the gate electrode, a semiconductor layer disposed on the gate insulating film and overlapping the gate electrode in a plan view, a source electrode disposed on the gate insulating film and overlapping a part of the semiconductor layer, a drain electrode disposed on the gate insulating film and separated from the source electrode on the semiconductor layer, and a first insulating film covering the source electrode, the drain electrode, and the semiconductor layer, wherein the gate insulating film includes a first stepped portion in a portion covering a peripheral portion of the gate electrode when the substrate is viewed from a normal direction, and the first insulating film includes a first opening at a position overlapping a portion of the first stepped portion not covered with both the source electrode and the drain electrode in a plan view.

According to the first configuration, the gate electrode is covered with the gate insulating film, and the semiconductor layer overlapping the gate electrode in a plan view is disposed on the gate insulating film. In addition, the source electrode and the drain electrode are separated from each other on the semiconductor layer, and the surfaces of the source electrode, the drain electrode, and the semiconductor layer are covered with the first insulating film. The first stepped portion is formed in a portion of the gate insulating film covering the peripheral portion of the gate electrode, and the first insulating film includes the first opening at a position overlapping a portion of the first stepped portion that is not covered with both the source electrode and the drain electrode in a plan view. Even in a case where the etching residue adheres to the first stepped portion when the source electrode and the drain electrode are formed in the step of manufacturing the active matrix substrate, the etching residue is exposed in the first opening of the first insulating film. For this reason, the etching residue exposed in the first opening is easily removed, and a short circuit between the source electrode and the drain electrode via the etching residue is less likely to occur.

In the first configuration, the active matrix substrate may further include a second insulating film including two contact holes on the semiconductor layer and covering the gate insulating film, wherein the source electrode and the drain electrode may be disposed on the second insulating film and in contact with the semiconductor layer in the two contact holes, and the second insulating film may have a step at a position overlapping the first opening in a portion covering the first stepped portion in a plan view (a second configuration).

According to the second configuration, the source electrode and the drain electrode are formed on the second insulating film and in contact with the semiconductor layer in the two contact holes of the second insulating film. The second insulating film includes a step in a portion covering the first stepped portion. For this reason, when the source electrode and the drain electrode are formed in the step of manufacturing the active matrix substrate, the etching residue easily adheres to the step of the second insulating film. However, in this configuration, since the first opening of the first insulating film exposing the step of the second insulating film is formed, the etching residue adhering to the step of the second insulating film is exposed in the first opening. For this reason, the etching residue exposed in the first opening is easily removed, and a short circuit between the source electrode and the drain electrode via the etching residue does not occur. In addition, by providing the second insulating film, the gate insulating film is not easily penetrated when the etching residue is removed, and the gate electrode is not easily exposed.

In the first or second configuration, the first insulating film may include a plurality of the first openings (a third configuration).

According to the third configuration, an effect of preventing a short circuit between the source electrode and the drain electrode is enhanced compared to the case in which the first insulating film includes one first opening.

In any one of the first to third configurations, the source electrode and the drain electrode may include a first metal layer and a second metal layer layered on the first metal layer and different from the first metal layer, the first insulating film may further include a second opening at a position overlapping the drain electrode in a plan view, and the first metal layer may be in contact with the semiconductor layer and the gate insulating film and have a lower etching resistance against an etchant containing hydrofluoric acid than an etching resistance of the second metal layer (a fourth configuration).

According to the fourth configuration, the first insulating film includes a first opening and a second opening at a position overlapping the drain electrode in a plan view. That is, a part of the drain electrode is exposed in the second opening. The source electrode and the drain electrode include a first metal layer in contact with the semiconductor layer and the gate insulating film and a second metal layer layered on the first metal layer. When the source electrode and the drain electrode are formed in the step of manufacturing the active matrix substrate, the first metal layer is more likely to adhere to the first stepped portion as an etching residue than the second metal layer. The second metal layer is less likely to be etched by an etchant, containing hydrofluoric acid than the first metal layer. For this reason, the etchant containing hydrofluoric acid can remove only the etching residue exposed in the first opening without removing the drain electrode exposed in the second opening.

In the fourth configuration, the active matrix substrate may include a gate wiring line connected to the gate electrode and a source wiring line intersecting the gate wiring line and connected to the source electrode, the gate wiring line may be covered with the gate insulating film, the gate insulating film may include a second stepped portion in a portion covering a peripheral portion of the gate wiring line when viewed from a normal direction of the substrate, and the first insulating film may further include a third opening at a position overlapping the second stepped portion in a plan view (a fifth configuration).

According to the fifth configuration, the active matrix substrate includes the gate wiring line connected to the gate electrode and the source wiring line connected to the source electrode. The gate insulating film includes a second stepped portion in a portion covering the peripheral portion of the gate wiring line, and the first insulating film includes a third opening on the second stepped portion. When the source electrode and the drain electrode are formed in the step of manufacturing the active matrix substrate, the etching residue easily adheres to the second stepped portion in addition to the first stepped portion. The adjacent source wiring lines may be short-circuited via the etching residue adhering to the second stepped portion. In this configuration, since the third opening is formed on the second stepped portion, the etching residue in the second stepped portion is exposed in the third opening. For this reason, similar to a case of the first opening, the etching residue exposed in the third opening can be easily removed, and a short circuit between the source electrode and the drain electrode and between the adjacent source wiring lines can be prevented.

In any one of the first to fifth configurations, the active matrix substrate may further include a cathode electrode connected to the drain electrode, a photoelectric conversion element disposed on the cathode electrode, and an anode electrode disposed on the photoelectric conversion element (a sixth configuration).

An X-ray imaging panel may include the active matrix substrate in any one of the first to sixth configurations and a scintillator configured to convert an emitted X-ray into fluorescence (a seventh configuration).

A method for manufacturing an active matrix substrate includes forming a gate electrode on a substrate, forming a gate insulating film covering the gate electrode and including a first stepped portion in a portion covering a peripheral portion of the gate electrode when viewed from a normal direction of the substrate, forming a semiconductor layer disposed on the gate insulating film and overlapping the gate electrode in a plan view, forming a source electrode and a drain electrode separated from each other on the semiconductor layer by etching a metal film using a photolithographic method after forming the metal film on the semiconductor layer and the gate insulating film, forming a first insulating film covering the gate insulating film, the semiconductor layer, the source electrode, and a part of the drain electrode, the first insulating film including a first opening at a position overlapping a portion of the first stepped portion that is not covered with both the source electrode and the drain electrode in a plan view, and removing an etching residue of the metal film after forming the first opening (a first manufacturing method).

According to the first manufacturing method, when the source electrode and the drain electrode are formed in the step of manufacturing the active matrix substrate, even in a case where the etching residue of the metal film adheres to the first stepped portion of the gate insulating film, the etching residue is exposed in the first opening of the first insulating film. For this reason, the etching residue is easily removed, and a short circuit between the source electrode and drain electrode via the etching residue does not occur.

In the first manufacturing method, the metal film may include a first metal layer and a second metal layer layered on the first metal layer and different from the first metal layer, the forming a first insulating film further includes forming a second opening at a position overlapping the drain electrode in a plan view, the removing an etching residue includes etching using an etchant containing hydrofluoric acid, and the first metal layer is in contact with the semiconductor layer and the gate insulating film and have a lower etching resistance against the etchant containing hydrofluoric acid than an etching resistance of the second metal layer (a second manufacturing method).

According to the second manufacturing method, the first insulating film includes the first opening and the second opening at a position overlapping the drain electrode in a plan view. That is, a part of the drain electrode is exposed in the second opening. The metal film that constitutes the source electrode and the drain electrode includes the first metal layer in contact with the semiconductor layer and the gate insulating film and the second metal layer layered on the first metal layer. In the forming a source electrode and a drain electrode, the first metal layer is more likely to adhere to the first stepped portion as an etching residue than the second metal layer. The second metal layer is less likely to be etched by an etchant containing hydrofluoric acid than the first metal layer. Thus, when the etching residue is removed using an etchant containing hydrofluoric acid, the drain electrode exposed in the second opening cannot be etched, and only the etching residue can be removed.

While preferred embodiments of the present invention have beer, described above, it is to be understood that variations and modifications will be apparent to those skilled in the art without departing from the scope and spirit of the present invention. The scope of the present invention, therefore, is to be determined solely by the following claims.

The invention claimed is:
1. An active matrix substrate comprising:
   a substrate;
   a gate electrode disposed on the substrate;
   a gate insulating film covering the gate electrode;
   a semiconductor layer disposed on the gate insulating film and overlapping the gate electrode in a plan view;
   a source electrode disposed on the gate insulating film and overlapping a part of the semiconductor layer;
   a drain electrode disposed on the gate insulating film and separated from the source electrode on the semiconductor layer; and
   a first insulating film covering the source electrode, the drain electrode, and the semiconductor layer,
   wherein the gate insulating film includes a first stepped portion in a portion covering a peripheral portion of the gate electrode when the substrate is viewed from a normal direction, and
   the first insulating film includes a first opening at a position overlapping a portion of the first stepped portion that is covered with neither the source electrode nor the drain electrode in a plan view.

2. The active matrix substrate according to claim 1, further comprising:
   a second insulating film including two contact holes on the semiconductor layer and covering the gate insulating film,
   wherein the source electrode and the drain electrode are disposed on the second insulating film and in contact with the semiconductor layer in the two contact holes, and
   the second insulating film includes a step at a position overlapping the first opening in a portion covering the first stepped portion in a plan view.

3. The active matrix substrate according to claim 1, wherein the first insulating film includes a plurality of the first openings.

4. The active matrix substrate according to claim 1,
   wherein the source electrode and the drain electrode include a first metal layer and a second metal layer layered on the first metal layer and different from the first metal layer,
   the first insulating film further includes a second opening at a position overlapping the drain electrode in a plan view, and
   the first metal layer is in contact with the semiconductor layer and the gate insulating film and has a lower etching resistance against an etchant containing hydrofluoric acid than an etching resistance of the second metal layer.

5. The active matrix substrate according to claim 4, further comprising:
   a gate wiring line connected to the gate electrode; and
   a source wiring line intersecting the gate wiring line and connected to the source electrode,
   wherein the gate wiring line is covered with the gate insulating film,
   the gate insulating film includes a second stepped portion in a portion covering a peripheral portion of the gate wiring line when viewed from a normal direction of the substrate, and the first insulating film further includes a third opening at a position overlapping the second stepped portion in a plan view.

6. The active matrix substrate according to claim 1, further comprising:
a cathode electrode connected to the drain electrode;
a photoelectric conversion element disposed on the cathode electrode; and
an anode electrode disposed on the photoelectric conversion element.

7. An imaging panel comprising:
the active matrix substrate according to claim 1; and
a scintillator configured to convert an emitted X-ray into fluorescence.

* * * * *